United States Patent [19]

Fukui et al.

[11] Patent Number: 5,041,369

[45] Date of Patent: Aug. 20, 1991

[54] PHOTOSENSITIVE MATERIAL AND IMAGE FORMING METHOD

[75] Inventors: Tetsuro Fukui, Kawasaki; Kazuo Yoshinaga, Machida; Hideaki Mitsutake, Tokyo; Katsuya Oikawa, Mitaka; Shinsuke Takeuchi, Yokohama; Takeshi Miyazaki, Ebina; Yoshio Takasu, Tama; Akihiro Mouri, Atsugi; Masato Katayama, Yokohama; Kazuo Isaka, Tokyo, all of Japan

[73] Assignee: Canon Kabushiki Kaisha, Tokyo, Japan

[21] Appl. No.: 322,123

[22] Filed: Mar. 13, 1989

[30] Foreign Application Priority Data

| Mar. 11, 1988 | [JP] | Japan | 63-056137 |
| Jul. 28, 1988 | [JP] | Japan | 63-186745 |
| Nov. 16, 1988 | [JP] | Japan | 63-287736 |
| Jan. 6, 1989 | [JP] | Japan | 64-524 |
| Jan. 10, 1989 | [JP] | Japan | 1-3398 |

[51] Int. Cl.$^5$ .............................................. G03C 1/06
[52] U.S. Cl. ................................ 430/619; 430/617; 430/944; 430/945; G03C/1/06
[58] Field of Search .............. 430/619, 617, 945, 955, 430/394

[56] References Cited

U.S. PATENT DOCUMENTS

| 3,314,073 | 4/1967 | Becker | 346/76 L |
| 3,874,947 | 4/1975 | Hayakawa et al. | 430/374 |
| 4,426,441 | 1/1984 | Adin et al. | 430/351 |
| 4,637,975 | 1/1987 | Kubodera et al. | 430/353 |
| 4,728,600 | 3/1988 | Hara et al. | 430/559 |

FOREIGN PATENT DOCUMENTS

| 3207064 | 8/1973 | Fed. Rep. of Germany . |
| 2111201 | 6/1972 | France . |
| 1316398 | 5/1973 | United Kingdom . |

OTHER PUBLICATIONS

J. J. Wrobel, Proceedings of SPIE, vol. 420 (1983), pp. 288-293.
C. L. Cohen, Electronics (1988) p. 48.
Patent Abstracts of Japan, vol. 10, No. 130, (M-478) (2187) May 14, 1986, JP 60-255483, Dec. 17, 1985.
Chemical Abstracts, vol. 101, 1984, p. 557, ref. 219944y, Columbus, Ohio, JP 59-38092, Jan. 3, 1984.

Primary Examiner—Charles L. Bowers, Jr.
Assistant Examiner—Janet C. Baxter
Attorney, Agent, or Firm—Fitzpatrick, Cella, Harper & Scinto

[57] ABSTRACT

A photosensitive material comprises a photosensitive and heat-developable element, and further a light-to-heat conversion element or a nonlinear optical function element. The photosensitive and heat-developable element comprises at least a photosensitive silver halide, an organic silver salt and a reducing agent. The light-to-heat conversion elemeht comprises at least one of an inorganic metal and an organic coloring matter. The nonlinear optical function element comprises a comprises a compound selected from the group consisting of an inorganic crystal, an organic crystal, a polymer, a polymeric liquid crystal, a polymeric composition and a polymeric liquid crystal composition. An image forming method employing the photosensitive material comprises the steps of imagewise exposing the material by use of a laser beam, heating the material and forming a polymer image on the material.

13 Claims, 6 Drawing Sheets

PHOTOSENSITIVE MATERIAL AND IMAGE FORMING METHOD

BACKGROUND OF THE INVENTION

1. Field of the Invention

The present invention relates to an optical memory photosensitive material of a DRAW (direct read after write) type and a photosensitive material of an ROM (read only memory) type. More particularly, it relates to a highly sensitive photosensitive material and an image forming method that employs said photosensitive material, for and in which writing is carried out by a photon-heat mode.

The present invention further relates to a photosensitive material capable of forming a polymer image by light and/or heat and an image forming method that employs said photosensitive material.

2. Related Background Art

Developments have been hitherto made on many types of optical recording mediums utilizing coherent laser beams. These optical recording mediums include optical discs exclusively used in ROM, such as video discs and compact discs, and DRAW mediums in which users can write only once.

As the DRAW mediums, those in which chalcogenide metal thin films are used have been developed in the early years, and besides these those in which organic dyes are used have now been made available through mass production. The writing of information in the DRAW mediums presently mass-produced is carried out by the so-called heat mode, in which, e.g., a recording layer is partially vaporized by irradiation with semiconductor laser beams or the like to form holes (or pits).

To carry out the writing by the heat mode as mentioned above, a "hollow structure" as shown in FIG. 20 is commonly employed from the viewpoint of sensitivity. Optical recording mediums having such a hollow structure are so constructed that a recording layer 31 is set inside and substrates 32 are partially fixed through a spacer 33 to form a hollow space 30, and therefore they have the disadvantages that no sufficient adhesion can be obtained between the respective members, resulting in a poor mechanical strength.

Mediums other than the above mass-produced DRAW mediums in which chalcogenide metals or organic dyes are used, include a DRAW medium comprising a recording layer (a silver thin film) formed by a wet treatment using a silver emulsion, as disclosed, for example, in Japanese Patent Application Laid-open Nos. 55-108995, 56-3399 and 56-49297. The writing of information in this DRAW medium is also carried out by the so-called heat mode in which the silver thin film is partially melted by irradiation with semiconductor laser beams or the like to form holes (or pits). Accordingly, the medium must have the "hollow structure".

Mediums other than the above optical recording mediums which has the hollow structure and in which writing is carried out by a heat mode, also include a medium comprising a recording layer containing a heat-developable dry silver salt (a photosensitive silver salt and a reducing agent), as disclosed, for example, in Japanese Patent Application Laid-open No. 57-171330. The recording using this recording medium is carried out by producing silver metal through exposure to light, causing oxidation-reduction reaction between the silver salt and the reducing agent by heating, and thus forming a silver image utilizing the silver metal as a catalyst where the recorded information can be read out utilizing a difference in the amount of the transmitted light at the silver image portion.

Hence, the recording medium employing the heat-developable dry silver salt is not required to have the hollow structure since no holes are formed, and is therefore advantageous in view of mechanical strength or cost.

Such a recording medium, however, requires a recording unit having both a light irradiation means and a heating means in carrying out the writing of information, resulting in a large-sized or complicated unit, and hence is not practical as the DRAW medium in which users carry out writing.

Moreover, since the medium has not particularly any substance that reflects read-out light, it is difficult to control the tracking, and also difficult to use semiconductor laser beams as read-out light.

In another aspect, such a recording medium employing the heat-developable dry silver salt has the disadvantage that sometimes the recorded information once written (such as dots formed of a silver image) can not be read out after a long period of time. This is responsible for the unauthorized reaction that may be caused after a long period of time between the silver salt and reducing agent remaining in the recording layer.

Also, among various image forming methods hitherto known, a method that requires no wet treatment and additionally has superior sensitivity, resolution and storage stability includes a method in which an image forming medium containing a photosensitive silver halide, an organic silver salt, a reducing agent and a polymerizable monomer (a polymer precursor) is subjected to imagewise exposure (such as contact exposure, projection exposure, or digital exposure), thermal amplification by heating, and then polymerization of the above polymer precursor, thus forming a polymer image (see Japanese Patent Application Laid-open Nos. 61-69062, 62-70836).

As the imagewise exposure for the above image forming medium, the digital exposure, in particular, is regarded important for the reasons that signals of image information can be processed and that the laser techniques having made great progress in recent years can be applied. It is further desired for the digital exposure to be carried out by using a semiconductor laser, from the view point of making the unit small.

Here, in order to carry out the imagewise exposure using a laser, as similarly applicable to the above optical recording medium disclosed in Japanese Patent Application Laid-open No. 57-171330, it is necessary for the above heat-developable dry silver salt to be optically sensitized to a laser wavelength region. It, however, is difficult for the dry silver salt to be sufficiently sensitized in the semiconductor laser wavelength region. There also is the disadvantage that the image forming medium having been optically sensitized has a poor storage stability.

However, as disclosed, for example, in Japanese Unexamined Patent Publications Nos. 63-18346, 63-18345, 63-19652 and 63-19653, second harmonics of laser beams (or second harmonic generation beams, hereinafter "SHG" beams) may be generated using a nonlinear optical device to carry out the imagewise exposure using the SHG beams, so that it becomes unnecessary to subject the heat-developable dry silver salt to the optical sensitization, which is difficult to effect, to the extent that the storage stability may be lowered. In that instance, however, the nonlinear optical device must be used in the recording unit, bringing about the problem that the unit is necessarily made large-sized and complicated.

SUMMARY OF THE INVENTION

The present invention was made in order to solve the above problems, and an object thereof is to provide a photosensitive material that is not required to employ the hollow structure, can write and read information with a compact recording unit, and can control tracking with ease, and an image forming method that employs the photosensitive material.

Another object of the present invention is to provide a photosensitive material that makes it possible to form a good image using a long wavelength laser such as a semiconductor laser, without subjecting an image forming medium to the optical sensitization which is difficult to effect and may cause a lowering of storage stability, and an image forming method that employs said photosensitive material.

Still another object of the present invention is to provide a photosensitive material having a superior stability with time of the recorded information.

The present invention provides a photosensitive material, comprising a photosensitive and heat-developable element, wherein the photosensitive material further comprises a light-to-heat conversion element.

In another embodiment, the present invention provides a photosensitive material, comprising a photosensitive and heat-developable element and a polymerizable element, wherein the photosensitive material further comprises a light-to-heat conversion element.

In still another embodiment, the present invention provides a photosensitive material, comprising a photosensitive and heat-developable element and a polymerizable element, wherein the photosensitive material further comprises a nonlinear optical function element.

The present invention also provides an image forming method, comprising the steps of;
a) subjecting a photosensitive material containing a photosensitive and heat-developable element and a polymerizable element, to imagewise exposure by imagewise irradiating the photosensitive material with a laser beam through a nonlinear optical device;
b) heating the photosensitive material; and
c) forming a polymer image on the photosensitive material.

Other and preferred embodiments of the present invention will become apparent from the following description.

DETAILED DESCRIPTION OF THE PREFERRED EMBODIMENTS

Figure 1:
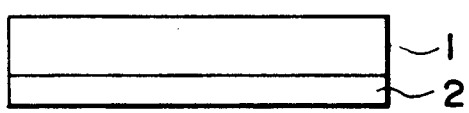
FIGS. 1 and 2 are diagramatical cross sections of photosensitive materials used in the method of the present invention.

A first embodiment of the image forming method of the present invention [hereinafter "the image forming method (I) of the present invention"] is an image forming method, comprising the steps of;
subjecting a photosensitive material containing a photosensitive and heat-developable element and a polymerizable element [hereinafter "the photosensitive material (I)"], to imagewise exposure by imagewise irradiating the photosensitive material with a laser beam through a nonlinear optical device;
heating the photosensitive material; and
forming a polymer image on the photosensitive material.

Herein, the photosensitive and heat-developable element is meant to be a component capable of being photosensitized and thermo-developed by imagewise exposure and heating, and may include any sort of component so long as it has such action, but, in particular, preferred is an element comprised of a photosensitive silver halide, an organic silver salt and a reducing agent. Also, the above polymerizable element refers to a component capable of being polymerized by light or heat, and is an element comprised of a polymerizable polymer precursor. Preferably it is an element further comprised of a photopolymerization initiator or a thermopolymerization initiator.

The nonlinear optical device also used in the image forming method (I) of the present invention refers to a device having the function of converting the wavelength of the light incident on the device to $\frac{1}{2}$ or $\frac{1}{3}$ (a nonlinear optical function).

In the image forming method (I) of the present invention, the step of forming a polymer image is meant to be a photopolymerization step carried out by subjecting the photosensitive material (I) to whole areal exposure, or a thermopolymerization step carried out by heating the photosensitive material (I).

Describing the image forming method (I) of the present invention in more detail, the image forming method (I) of the present invention is an image forming method, comprising the steps of;
(a) exposing to light the photosensitive material (I) containing at least a photosensitive silver halide, an organic silver salt, a reducing agent and a polymerizable polymer precursor, using a secondary harmonic (SHG beam) obtained from a laser beam through a nonlinear optical device, in accordance with image information to form a latent image comprised of silver metal;
(b) heating the photosensitive material (I) on which the latent image has been formed, to convert the latent image into a latent image comprised of the reducing agent and the oxidized product produced from the reducing agent by the heating (i.e., a thermal amplification step); and
(c) subjecting said photosensitive material (I) having the latent image comprised of said reducing agent and oxidized product, to whole areal exposure or heating to polymerize said polymerizable polymer precursor, corresponding to the distribution of said reducing agent and oxidized product, thereby forming a polymer image.

In the step (a) in the image forming method (I) of the present invention, the laser beam that can be utilized as a fundamental laser beam for the irradiation with laser beams include, for example, beams from solid lasers such as a YAG laser (wavelength: 1.064 μm), a ruby laser (690 μm), a Nd$^{3+}$: glass laser (1.054 to 1.062 μm), a color center laser, and an ion-implanted crystalline laser (700 to 2,200 nm); gas lasers such as a He-Ne laser (633 nm), a Xe laser (2.03 μm), an Ar$^+$ laser (488, 515 nm), a Kr$^+$ laser (647 nm), a HF laser (2.6 to 3.3 μm), and an iodine laser (1.32 μm); a dye laser (0.3 to 1.6 μm), and a semiconductor laser (0.7 to 1.5 μm). Among these, the semiconductor laser, which can be modulated with ease and also is very compact, is suited as a recording unit to be used the present invention. The wavelength of the SHG beam used in the present invention ranges from 300 nm to 600 nm, and preferably from 350 nm to 550 nm, and as to the power for the SHG beam, suited for use is a power with an emission output of from 0.01 mW to 10 mW, and preferably from 0.1 mW to 3 mW.

The nonlinear optical device used in the present invention will be described later.

Next, in the step (b) of the image forming method (I) of the present invention, the heating is carried out by appropriately selecting conditions necessary for the oxidation-reduction reaction to proceed. Though not sweepingly describable since heating conditions depend on the composition, etc. of the photosensitive layer, the heating may preferably be carried out at 60° C. to 180° C., and more preferably 100° C. to 150° C., for 1 second to 5 minutes, and more preferably 3 seconds to 60 seconds. In general, the heating at high temperatures completes the heating in a short time, and the heating at low temperatures requires heating for a long time. A heating means includes a method in which a hot plate, heat roll, thermal head or the like is used, as well as a method in which a heating element of the support is electrified or the irradiation with a laser beam effected to carry out the heating. Usually the heating is made under substantially uniform heating.

The above steps (a) and (b) may be simultaneously carried out.

In the instance where the polymer image is formed by photopolymerization in the step (c) of the image forming method (I) of the present invention, the photosensitive material is subjected to whole areal exposure under an energy of up to 500 mJ/cm$^2$ using light with a wavelength of from 250 nm to 700 nm, and preferably from 300 nm to 500 nm. As light sources used in the above, usable are, for example, sunlight, tungsten lamps, mercury lamps, halogen lamps, xenon lamps, fluorescent lamps, LEDs, and lasers, and the wavelength of light used in these steps may be the same as or different from the one used in the above step (a). Even if the light having the same wavelength is used, the latent image can be sufficiently written with use of light having an intensity of the level that may not cause photopolymerization in the above step (a), since the silver halide usually has a sufficiently higher photosensitivity than the photopolymerization initiator.

In the above step (c), the photosensitive material may be additionally heated for the purpose of more accelerating photopolymerization, or the thermal inertia in the above step (b) may be utilized.

In the instance where the polymer image is formed by thermopolymerization, the heating is carried out at 70° to 180° C., and preferably at 80° to 150° C., for 1 to 100 seconds.

The photosensitive material (I) used in the image forming method (I) of the present invention will be described below in detail.

The photosensitive silver halide contained in the photosensitive material (I) used in the image forming method (I) of the present invention may include silver chloride, silver bromide, silver chlorobromide, silver iodobromide and silver chloroiodobromide, and these may be subjected to chemical sensitization or optical sensitization as conventionally done with respect to ordinary photographic emulsions. More specifically, usable as the chemical sensitization are sulfur sensitization, noble metal sensitization and reduction sensitization, and utilizable as the optical sensitization are methods in which conventionally well known sensitizing dyes are used.

The organic silver salt contained in the photosensitive material (I) used in the image forming method (I) of the present invention includes silver salts of aliphatic carboxylic acids, aromatic carboxylic acids, thiocarbonyl compounds having a mercapto group or α-hydrogen, and imino group-containing compounds.

The aliphatic carboxylic acids include acetic acid, butyric acid, succinic acid, sebacic acid, adipic acid, oleic acid, linolic acid, linolenic acid, tartaric acid, palmitic acid, stearic acid, behenic acid and camphor acid, but, in general, silver salts having a smaller number of carbon atoms are proportionally unstabler, and hence those having an appropriate number of carbon atoms are preferred.

The aromatic carboxylic acids include benzoic acid derivatives, quinolinic acid derivatives, naphthalene carboxylic acid derivates, salicylic acid derivatives, gallic acid, tannic acid, phthalic acid, phenyl acetic acid derivatives, and pyromellitic acid.

The compounds having a mercapto or thiocarbonyl group include 3-mercapto-4-phenyl-1,2,4-triazole, 2-mercaptobenzoimidazole, 2-mercapto-5-aminothiadiazole, 2-mercaptobenzothiazole, S-alkylthioglycolic acid (alkyl group carbon atom number of 12 to 22), dithiocarboxylic acids such as dithioacetic acid, thioamides such as thiostearoamide, and mercapto compounds such as 5-carboxy-1-methyl-2-phenyl-4-thiopyridine, mercaptotriazine, 2-mercaptobenzoxazole, mercaptooxadiazole, and 3-amino-5-benzylthio-1,2,4-triazole, which are described in U.S. Pat. No. 4,123,274.

The compounds having an imino group typically include benzotriazole or derivatives thereof, described in Japanese Patent Publication No. 44-30270 or No. 45-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles as described in Japanese Patent Application Laid-open No. 58-118639, sulfobenzotriazole, carboxybenzotriazole or salts thereof, or hydroxybenzotriazole as described in Japanese Patent Application Laid-open No. 58-118638, 1,2,4-triazole as described in U.S. Pat. No. 4,220,709, or 1H-tetrazole, carbazole, saccharin, imidazole, and derivatives thereof.

As reducing agent contained in the photosensitive material (I) used in the image forming method (I) of the present invention, any conventional reducing agent may be used, but it is particularly preferred in view of the contrast of polymer images to use the reducing agent that exhibits the following action (a) or (b) in the step of thermal amplification [step (b)].

(a) A reducing agent that produces a compound capable of generating polymerization inhibitory power upon oxidation. The polymerization inhibitory power refers to a polymerization inhibitory power against the polymerizable polymer precursor contained in the photosensitive material.

(b) A reducing agent that can produce, upon oxidation, a compound capable of acting as a photopolymerization initiator to the polymerizable polymer precursor.

Employment of the above reducing agent (b) enables the polymerization of the polymer precursor to be carried out by photopolymerization.

The reducing agent (a) includes at least one compound selected from the group of compounds represented by the following Formulas (I), (II) and (III).

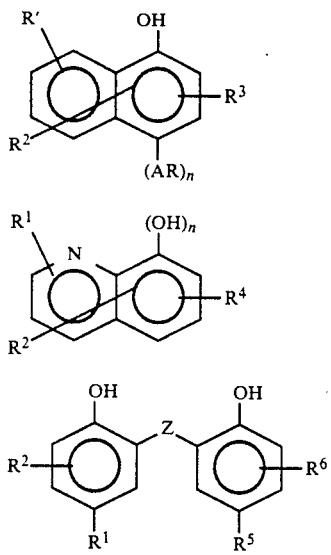

In the above Formulas (I), (II) and (III), $R^1$, $R^2$, $R^3$, $R^5$ and $R^6$ each independently represent a hydrogen atom, a halogen atom, a hydroxyl group, a substituted or unsubstituted alkyl group, a substituted or unsubstituted aralkyl group, a substituted or unsubstituted aryl group, an alkoxyl group, or a substituted or unsubstituted cycloalkyl group; $R^4$ represents a hydrogen atom, a halogen atom, a substituted or unsubstituted alkyl group, a substituted or unsubstituted aralkyl group, a substituted or unsubstituted aryl group, a substituted or unsubstituted cycloalkyl group, a carboxyl group, or a carboxylic acid ester group; A represents an oxygen atom, or a sulfur atom; R represents a hydrogen atom, an unsubstituted alkyl group, or a substituted or unsubstituted aralkyl group; n represents 0 or 1; and Z is a divalent linking group and represents an alkylidene group, an aralkylidene group, or a sulfur atom.

The compound represented by the above Formula (I), (II) or (III) has the action of generating a polymerization inhibitory power upon oxidation, and is a compound very suited for imparting the characteristic that the imagewise unexposed area of the photosensitive material (I) undergoes polymerization.

The substituents represented by $R^1$ to $R^6$ in Formulas (I) to (III) are exemplified below in more detail.

The halogen atom includes a fluorine atom, a chlorine atom, a bromine atom, and an iodine atom.

The substituted or unsubstituted alkyl group includes a straight-chain or branched alkyl group having 1 to 18 carbon atoms, as exemplified preferably by methyl, ethyl, propyl, i-propyl, butyl, t-butyl, i-butyl, amul, i-amyl, hexyl, texyl, heptyl, octyl, nonyl, dodecyl, stearyl, methoxyethyl, ethoxyethyl, ethoxypropyl, ethoxybutyl, propxybutyl, i-propoxyentyl, t-butoxyethyl, hexyloxybutyl, hydroxymethyl, hydroxyethyl, hydroxypropyl, hydroxybutyl, hydroxypentyl, hydroxyhexyl, hydroxyheptyl, aminomethyl, dimethylaminomethyl, aminoethyl, dimethylaminoethyl, diethylaminoethyl, morpholinoethyl, piperidinoethyl, aminopropyl, diethylaminopropyl, dipropylaminoethyl, aminobutyl, and morpholinobutyl.

The substituted or unsubstituted aralkyl group includes those having 7 to 19 atoms, as exemplified preferably by benzyl, phenetyl, benzhydryl, trityl, phenylpropyl, naphthylmethyl, chlorobenzyl, dichlorobenzyl, methoxybenzyl, and methylbenzyl.

The substituted or unsubstituted aryl group include those having 6 to 16 carbon atoms, as exemplified preferably by phenyl, naphthyl, anthryl, phenanthryl, tolyl, xylyl, cumenyl, mesityl, chlorophenyl, methoxyphenyl, and fluorophenyl.

The alkoxyl group includes those having 1 to 18 carbon atoms, as exemplified preferably by methoxy, ethoxy, propoxy, i-propoxy, and butoxy.

The substituted or unsubstituted cycloalkyl group includes those having 5 to 18 carbon atoms, as exemplified preferably by cyclopentyl, cyclohexyl, cycloheptyl, cyclooctyl, methylcyclohexyl, dimethylcyclohexyl, and ethylcyclohexyl.

The carboxylic acid ester group includes those having 2 to 10 carbon atoms, as exemplified preferably by methoxycarbonyl, ethoxycarbonyl, and propoxycarbonyl.

The alkylidene group includes those having 1 to 8 carbon atoms, as exemplified preferably by methylene, ethylidene, butylidene, and hexylidene.

The aralkylidene group includes those having 7 to 18 carbon atoms, as exemplified preferably by benzylidene, naphthylmethylene, p-dimethylaminophenylmethylene, p-hydroxyphenylmethylene, and p-tolylmethylene.

Of the compounds (reducing agents) represented by the above Formulas (I) to (III), specific examples of particularly preferred compounds are set out below, but the reducing agent used in the present invention is by no means limited to these.

Specific examples of the compounds represented by Formula (I) includes, for example, 1,4-dihydroxynaphthalene, 4-methoxy-1-naphthol, 4-ethoxy-1-naphthol, 5-methyl-4-methoxy-1-naphthol, 1,5-dihydroxynaphthalene, 4-chloro-1-naphthol, 5-chloro-1-naphthol, 4-methylthio-1-naphthol, 4-ethylthio-1-naphthol, 6-phenyl-4-methyl-1-naphthol, 6-phenyl-4-methoxy-1-naphthol, 6-benzyl-1-naphthol, 6-benzyl-4-methoxy-1-naphthol, 4-methyl-1,7-dihydroxynaphthalene, 4-methoxy-6-benzyl-1naphthol, 4-methoxy-6-cyclohexyl-1-naphthol, 4-methylthio-6-cyclohexyl-1-naphthol, 3,4-dimethyl-1-naphthol, and 4-benzyloxy-1-naphthol.

Specific examples of the compound represented by Formula (II) includes, for example, 8-hydroxyquinoline, 4,8-dihydroxyquinoline-2-carboxylic acid, 4-hydroxyquinoline-2-carboxylic acid, 4-methyl-8-hydroxyquinoline, 4-benzyl-8-hydroxyquinoline, and 4,8-dihydroxy-5-methylquinoline.

Specific examples of the compound represented by Formula (III) includes, for example, 2,2'-methylenebis(6-t-butyl-1,4-dihydroxybenzene), 2,2'-methylenebis(4-methoxyphenol), 2,2'-methylenebis(4,6-di-t-butylphenol), 2,2'-methylenebis(4-methyl-6-t-butylphenol), 2,2'-butylidenebis(4-methoxyphenol), 2,2'-butylidenebis(6-t-butyl-1,4-dihydroxybenzene), 2,2'-thiobis(4-methoxyphenol), 2,2'-thiobis(6-methyl-1,4-dihydroxybenzene), 2,2'-thiobis(4,6-di-t-butylphenol), bis(2-hydroxy-5-methylphenyl)phenylmethane, and (3-t-butyl-5-methyl-2-hydroxyphenyl)-(5-methoxy-2-hydroxyphenyl)methane.

Of the above reducing agents, two or more may be used in combination, and it is also possible to use these compounds in combination with any conventionally known reducing agents so long as the object of the present invention may not be hindered.

As the above reducing agent (b), a compound represented by the following Formula (IV) can be typically used.

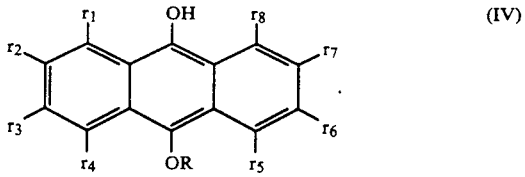

In the formula, R represents a hydrogen atom, a substituted or unsubstituted alkyl group, an alkenyl group, an alkynyl group, an aryl group, an aralkyl group, an alkoxyalkyl group, or an acyl group; $r_1$, $r_2$, $r_3$, $r_4$, $r_5$, $r_6$, $r_7$ and $r_8$ each independently represent a hydrogen atom, a halogen atom, a substituted or unsubstituted alkyl group, an alkoxyl group, a hydroxyl group, a substituted or unsubstituted amino group, an amido group, an aryl group, an alkenyl group, an alkynyl group, a carboxyl group, a sulfonyl group, or a sulfoxyl group, which may be the same as or different from each other, and in which any of $r_1$ to $r_8$, or R, may serve as a divalent linking group to give a dimer or $r_1$ and $r_2$, $r_2$ and $r_3$, $r_3$ and $r_4$, $r_5$ and $r_6$, $r_6$ and $r_7$, or $r_7$ and $r_8$ may be combined to form a condensed ring.

Synthesis methods for these are described in Anallen der Chemie, Vol. 379, page 67, Journal of Chemical Society, Vol. 123, p. 2029, Journal of American Chemical Society, Vol. 70, p. 3738, Berichite der Chemie, Vol. 63, p. 1690, and Berchite der Chemie, Vol. 63, p. 1301, etc.

Specifically the reducing agent (b) may include, for example, anthrahydroquinone derivatives such as anthrahydroquinone, 1-methylanthrahydroquinone, 2-methylanthrahydroquinone, 1-ethylanthrahydroquinone, 2-ethylanthrahydroquinone, 1-acetylaminoanthrahydroquinone, 2-acetylaminoanthrahydroquinone, anthrahydroquinone monomethyl ether, anthrahydroquinone monoethyl ether, 1-hydroxyanthrahydroquinone, 1,4-dihydroxyanthrahydroquinone, 1-methylanthrahydroquinone monomethyl ether, 2-methylanthrahydroquinone monoethyl ether, 2-ethylanthrahydroquinone monoethyl ether, 1-dimethylaminoanthrahydroquinone, 1-dimethylaminoanthrahydroquinone monomethyl ether, 2-aminoanthrahydroquinone, 2-diethylaminoanthrahydroquinone monoethyl ether, 2-propionic acid amide anthrahydroquinone, 1-chloroanthrahydroquinone, 1-chloroanthrahydroquinone monopropyl ether, 2-chloroanthrahydroquinone, 2-chloroanthrahydroquinone monomethyl ether, 1,5-dichloroanthrahydroquinone monoethyl ether, and bis(anthrahydroxy-2-)glyoxylic acid amide. These may be used appropriately in combination of two or more.

As the polymerizable polymer precursor incorporated in the photosensitive material (I) used in the present invention, a compound having at least one reactive vinyl group in its molecule can be utilized, and there can be used, for example, at least one selected from the group consisting of reactive vinyl group-containing monomers, reactive vinyl group-containing oligomers and reactive vinyl group-containing polymers.

The reactive vinyl group in these compounds includes substituted or unsubstituted vinyl groups having polymerization reactivity, as exemplified by styrene vinyl groups, acrylic acid vinyl groups, methacrylic acid vinyl groups, allyl vinyl groups, and vinyl ethers, as well as ester vinyl groups such as vinyl acetate.

Specific examples of the polymerizable polymer precursor satisfying such conditions are as follows.

They may include monovalent monomers as exemplified by styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, $\beta$-chloroethyl vinyl ether, phenyl vinyl ether, p-methylphenyl vinyl ether, and p-chlorophenyl vinyl ether; divalent monomers as exemplified by divinylbenzene, distyryl oxalate, distyryl malonate, distyryl succinate, distyryl glutarate, distyryl adipate, distyryl maleate, distyryl fumarate, distyryl $\beta,\beta'$-dimethylglutarate, distyryl 2-bromoglutarate, distyryl $\alpha,\alpha'$-dichloroglutarate, distyryl terephthalate, oxalic acid di(ethyl acrylate), oxalic acid di(methyl ethyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(ethyl acrylate), fumaric acid di(ethyl acrylate), $\beta,\beta'$-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(methyl ethyl methacrylate), $\beta,\beta'$-dimethylglutaric fumaric acid di(methyl ethyl methacrylate), $\beta,\beta'$-dimethylglutaric acid di(ethyl methacrylate), 1,4-phenylenebis(oxyethyl methacrylate), and 1.4-bis(methacryloyloxyethoxy)cyclohexane acryloyloxyethoxyethyl vinyl ether; trivalent monomers as exemplified by pentaerythritol triacrylate, pentaerythritol trimethacrylate, pentaerythritol tri(hydroxystyrene), cyanuric acid triacrylate, cyanuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethyl acrylate), cyanuric acid tri(ethyl vinyl ether), a condensate of a reaction product between 1,1,1-trimethylolpropane and three-fold mols of toluenediisocyanate, with hydroxyethyl acrylate, and a condensate of a reaction product between 1,1,1-trimethylolpropane and three-fold mols of hexanediisocyanate, with p-hydroxystyrene; tetravalent monomers as exemplified by ethylenetetraacrylamide, and propylenetetraacrylamide; hexavalent monomers as exemplified by dipentaerythritol hexaacrylate; and also a polymerizable polymer precursor comprising a reactive vinyl group remaining at the terminal of an oligomer or polymer, or a polymerizable polymer precursor comprising a reactive vinyl group remaining at the side chain of an oligomer or polymer.

As above-mentioned, these polymerizable polymer precursors may be used in combination of two or more.

The photopolymerization initiator contained in the photosensitive material (I) used in the present invention includes, for example, carbonyl compounds, sulfur compounds, halogen compounds, and photopolymerization initiators of redox type.

Specifically, the carbonyl compounds include diketones as exemplified by benzyl, 4,4-dimethoxybenzyl, diacetyl, and camphorquinone; benzophenones as exemplified by 4,4'-dimethoxyaminobenzophenone, and 4,4'-dimethylbenzophenone; acetophenones as exemplified by acetophenone, 4-methoxyacetophenone; benzoin alkyl ethers; thioxanthones as exemplified by 2-dichlorothioxanthone, 2,5-diethylthioxanthone, and thioxanthone-3-carboxylic acid-$\beta$-methoxy ethyl ester; chalcones and styrylketones having a dialkylamino group; and coumarines as exemplified by 3,3'-carbonylbis(7-methoxycumarine), and 3,3'-carbonylbis(7-diethylaminocoumarin).

The sulfur compounds include disulfides as exemplified by dibenzothiazolyl sulfide, decylphenyl sulfide and disulfides.

The halogen compounds include, for example, carbon tetrabromide, quinolinesulfonyl chloride, and S-triazines having a trihalomethyl group.

The photopolymerization initiators of redox type include those used in combination of a trivalent iron ionic compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above, two or more compounds can also be used in combination to obtain a more efficient photopolymerization reaction.

Such combination of the photopolymerization initiators includes a combination of chalcones styrylketones or coumarins having a dialkylamino group, with S-triazines having a trihalomethyl group or camphorquinone.

Known initiators can be used as the thermopolymerization initiator, which may include, for example, azo initiators and peroxide initiators. The azo initiator refers to an organic compound having at least one nitrogen-nitrogen double bond in its molecule, and may include, for example, azobisisobutyronitrile, azobiscyclohexanecarbonitrile, azobismethylphenethylcarbonitrile, azobis-secamylonitrile, azobisphenylethane, azobiscyclohexylpropylonitrile, azobismethylchloroethane, triethylazobenzene, phenylazoisobutyronitrile, and 9-(p-nitrophenylazo)-9-phenylfluorenone. The peroxide type initiator includes almost all the compounds so long as they are organic compounds having at least one oxygen-oxygen bond in the molecule. For example, it may include methyl ethyl ketone peroxide, cyclohexanone peroxide, 3,3,5-trimethylcyclohexanone peroxide, methylcyclohexanone peroxide, acetylacetone peroxide, 1,1'-bis(tertiary-butylperoxy)-3,3,5-trimethylcyclohexane, 1,1'-bis(tertiary-butylperoxy) cyclohexane, n-butyl-4,4-bis(tertiarybutylperoxy)valerate, 2,2'-bis(tertiarybutylperoxy)butane, tertiry-butyl hydroperoxide, cumene hydroperoxide, diisopropylbenzene hydroperoxide, para-menthane hydroperoxide, 2,5-diemethylhexane-2,5-dihydroperoxide, 1,1,3,3-tetramethylbutyl hydroperoxide, ditertiary-butyl peroxide, tertiary-butylcumyl peroxide, dicumyl peroxide, $a,a'$-bis(tertiary-butylperoxyisopropyl) benzene, 2,5-dimethyl-2,5-di(tertiary-butylperoxy) hexane, 2,5-dimethyl-2,5-di(tertiary-butylperoxy) hexyne-3-acetyl peroxide, isobutyl peroxide, octanoyl peroxide, decanoyl peroxide, lauroyl peroxide, 3,5,5-trimethylhexanoyl peroxide, succinic acid peroxide, benzoyl peroxide, 2,4-dichldorobenzoyl peroxide, m-toluoyl peroxide, diisopropyl peroxydicarbonate, di-2-ethylhexyl peroxydicarbonate, dinormalpropyl peroxydicarbonate, di-2-ethoxyethyl peroxydicarbonate, dimethoxyisopropyl peroxydicarbonate, di(3-methyl-3-methoxybutyl)peroxydicarbonate, tertiary-butyl peroxyacetate, tertiary-butyl peroxyisobutyrate, tertiary-butyl peroxypivarate, tertiary-butyl peroxyneodecanoate, tertiary-butyl peroxyoctanoate, tertiary-butyl peroxy-3,5,5-trimethylhexanoate, tertiary-butyl peroxylaurate, tertiary-butyl peroxybenzoate, ditertiary-diperoxyisophthalate, 2,5-dimethyl-2,5-di(benzoylperoxy)hexane, tertiary-butyl maleic acid peroxide, and tertiary-peroxyisopropylcarbonate, by which, however, the present invention is by no means limited, and other known thermopolymerization initiators can also be used.

In the thermopolymerization initiator described above, two or more compounds may be used in combination to achieve more efficient photopolymerization initiator and thermopolymerization thermopolymerization reaction, and further the photopolymerization initiator and thermopolymerization initiator may be used in combination.

In instances in which a photosensitive material is formed by laminating a photosenistive layer 1 on a support 2 as illustrated in FIG. 1, the photosensitive material (I) used in the image forming method (I) of the present invention can be formed by dissolving the above components in a solvent together with a binder approriately used, and coating the resulting solution on the support 2, followed by drying. If, however, the photosensitive layer 1 itself has a supporting function, the support 2 is dispensable.

Figure 2:
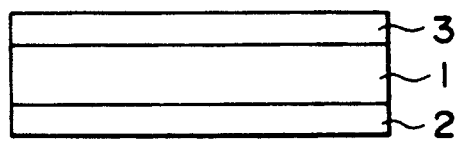

In molding the photosensitive material (I) into a desired form, it may be of any form including a flat sheet, a cylinder, a roll and so forth, without any particular limitations. When formed into a layer, the layer may have a thickness of from 0.005 $\mu$m to 2 mm, mm, and preferably from 0.1 $\mu$m to 0.1 mm. Also, the photosensitive layer may not be limited to a single layer. A protective layer 3 may also be provided on the photosensitive layer 1 for the purpose of preventing the inhibition by oxygen in carrying out the polymerization (FIG. 2).

Suitable binders contained in the photosensitive material (I) used in the image forming method (I) of the present invention can be selected from a wide range of resins.

They specifically include cellulose esters as exemplified by nitrocellulose, cellulose phosphate, cellulose sulfate, cellulose acetate, cellulose propionate, cellulose butyrate, cellulose myrystate, cellulose palmitate, cellulose acetate.propionate, and cellulose acetate.butyrate; cellulose esters as exemplified by methyl cellulose, ethyl cellulose, propyl cellulose, and butyl cellulose; vinyl resins as exemplified by polystyrene, polyvinyl chloride, polyvinyl acetate, polyvinyl butyral, polyvinyl acetal, polyvinyl alcohol, and polyvinyl pyrrolidone; copolymer resins as exemplified by a styrene/butadiene copolymer, a styrene/acrylonitrile copolymer, a styrene/butadiene/acrylonitrile copolymer, and a vinyl chloride/vinyl acetate copolymer; acrylic resins as exemplified by polymethyl methacrylate, polymethyl acrylate, polybutyl acrylate, polyacrylic acid, polymethacrylic acid, polyacrylamide, and polyacrylonitrile; polyesters as exemplified by polyethylene terephthalate; polyacrylate resins as exemplified by poly(4,4'-isopropylidene, diphenylene-co-1,4-cyclohexylenedimethylene carbonate), poly(ethylenedioxy-3,3'-phenylene thiocarbonate), poly(4,4'-isopropylidene, diphenylene carbonate-coterephthalate), poly(4,4'-isopropylidene, diphenylene carbonate), poly(4,4'-sec-butylidene,diphenylene carbonate), and poly(4,4'-isopropylidene, diphenylene carbonate-block-oxyethylene); polyamides; polyimides; epoxy resins; phenol resins; polyolefins as exemplified by polyethylene, polypropylene, and chlorinated polyethylene; and natural polymers such as gelatin.

It is also possible to incorporate sensitizing coloring matters such as cyanine dyes and merocyanine dyes including merocyanine dyes having an additional rhodanine ring.

In the photosensitive material (I) used in the image forming method (I) of the present invention, the components described above may preferably be used in the proportion as follows:

The silver halide should preferably be contained in an amount of from 0.001 mol to 2 mols, and more preferably from 0.05 to 0.4 mol, per mol of the organic silver salt. The reducing agent should preferably be contained in an amount of from 0.05 mol to 3 mols, and more preferably from 0.2 mol to 1.3 mol, per mol of the organic silver salt. The photopolymerization initiator or thermopolymerization initiator should preferably be contained in an amount of from 0.1 part by weight to 30 parts by weight, and more preferably from 0.5 part by weight to 10 parts by weight, based on 100 parts by weight of the polymerizable polymer precursor. The photopolymerization initiator or thermopolymerization initiator should preferably be contained in an amount of from 0.01 mol to 10 mols, and more preferably from 0.5 mol to 3 mols, per mol of the reducing agent.

In the image forming method (I) of the present invention that employs the photosensitive material (I) described above in detail, the imagewise exposure is carried out using the SHG beam. Hence, even when a long wavelength laser such as the semiconductor laser is used as a light source, no optical sensitization is required for the photosensitive material (I), or optical sensitization applied simply and to the extent that the storage stability may not be affected is sufficient for it, and the writing can be made with high details because of the writing with short wavelengths light.

The photosensitive material (I) used in the image forming method (I) of the present invention, which contains the silver halide, also has a sufficiently practical sensitivity even if the nonlinear optical device has a low conversion efficiency and the SHG beams has a low power.

The photosensitive material (I) used in the image forming method (I) of the present invention also contains the reducing agent represented by the above Formula (I) to (IV), so that the method (I) of the present invention can obtain a polymer image with a sufficiently good contrast even in writing a highly detailed image by use of the SHG beam.

Modulation of laser beams by utilizing the nonlinear optical device will be described below.

A fundamental wave $\omega$ and a wavelength-converted wave $\omega_m$ can be obtained by using a laser beam source and a nonlinear optical device, and as a result a large-output shortwave laser beam can be obtained with a compact unit. At the same time it becomes possible to obtain wavelengths in the number of $(m-1)$.

Nonlinear optical effect is the effect that uses the nonlinear susceptibility expressed by the formula $X^{(n)}$ ($n \geq 2$) in the nonlinear polarization of a substance, which is represented by the following formula (1):

$$|P = \epsilon_o X^{(1)}|E + \epsilon_o X^{(2)}|E^2 + \epsilon_o X^{(3)}|E^3 + \ldots \quad (1)$$

Secondary nonlinear susceptibility:
  Optical second harmonic generation: $\omega + \omega \rightarrow 2\omega$
  Sum-difference cycle generation: $\omega_1 \pm \omega_2 \rightarrow \omega_3$
  Optical parametric oscillation: $\omega_3 \rightarrow \omega_1 \pm \omega_2$
Tertiary nonlinear susceptibility:
  Optical third harmonic generation: $\omega + \omega + \omega \rightarrow 3\omega$
  Four lightwave mixing: $\omega_1 \pm \omega_2 \pm \omega_3 \rightarrow \omega_4$
  Electric field inducing second harmonic generation: $\omega + \omega + 0 \rightarrow 2\omega$
  Three lightwave mixing: $-\omega_1 - \omega_1 + \omega_2 \rightarrow \omega_2 - 2\omega_1$
  Induced Brillouin, Raman scattering A compound having such nonlinear susceptibility includes the followings:
Inorganic crystals: $LiNbO_3$, KDP, $LiIO_3$, ADP, etc.
Organic crystals: Urea, $\alpha$-resorcinol, m-nitroaniline, 3-methyl-4-nitropyridine-1-oxide, etc.
Polymers: Polyvinylidene fluoride, poly(vinylidene cyanide-vinyl acetate), etc.
Polymeric liquid crystals:

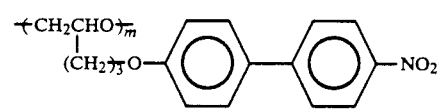

Polymeric compositions: Those comprising p-nitroaniline dissolved in polyoxyethylene, those comprising p-nitroaniline dissolved in poly-$\epsilon$-caprolactam, etc.
Polymeric liquid crystal compositions:

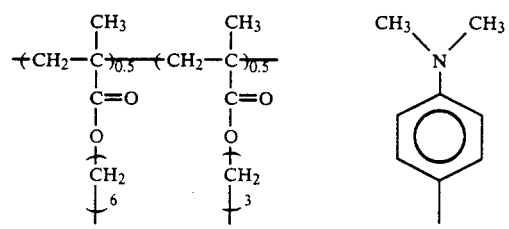

-continued

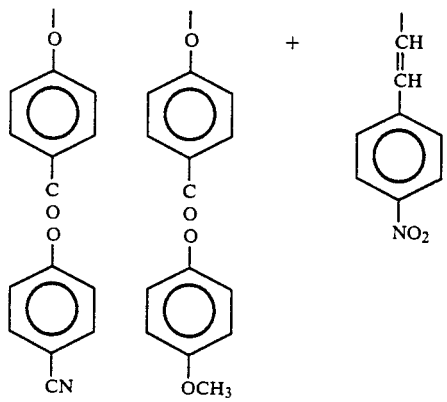

Liquid crystals: Decyloxybenzylidene anilido-2-methylbutyl-cinnamate, pentyloxycyanobiphenyl, etc.

The above inorganic crystals and organic crystals must be formed into monocrystals before use, but with difficulty in general. Moreover, they have a low threshold value for the beam damage against incident laser beams. Compared with them, the polymers, polymeric liquid crystals, polymeric compositions and polymeric liquid crystal compositions can be so readily made into devices and yet have so large a nonlinear optical function that they are suited for use in the present invention.

Typical polymeric compositions include those comprising a polyoxyalkylene matrix in which a compound having a large molecular nonlinear optical function is added, and having been subjected to molecular alignment.

Specifically the polyoxyalkylene is represented by the following formula (2):

In the formula, R represents an alkylene group having 1 to 6 carbon atoms, and n is 10 to 200,000.

The alkylene group having 1 to 6 carbon atoms can be used as R, but the one having 7 or more carbon atoms may result in a decrease in the compatibility with a compound having an electron attractive substituent and an electron donative substituent, and hence can not give films with excellent physical properties. Of these, particularly preferred is a polyoxyalkylene having 2 to 4 carbon atoms.

The above polyoxyalkylene can be effective, even if it constitutes part of the matrix, or can also be utilized by incorporating it into any other compound by copolymerization or by mixing it with any other compound by blending.

The manner by which it is incorporated by copolymerization include the following:

(i) It is utilized as the side chain of the backbone polymer as shown in the following general formula (I):

Here, a polyoxyalkylene represented by —(—R—O—)$_m$— may be bonded to at least part of the backbone chain represented by —(A—)$_m$—. It may also have a crosslinked structure.

(ii) It is utilized by constituting repeating units as the backbone chain as represented by the following general formula (II):

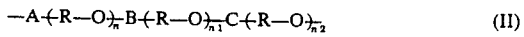

A, B, C and so on may each have the same or different structure.

(iii) A polyoxyalkylene in which the above structures (i) and (ii) form a cyclic structure.

The compound having the polyoxyalkylene specifically include the following:

wherein R represents an alkylene group having 1 to 6 carbon atoms, $R_1$ and $R_2$ each represent an alkyl group having 1 to 20 carbon atoms, and n=2 to 10,000.

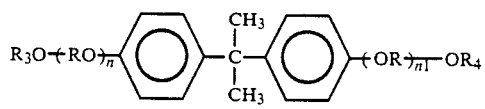

wherein R represents an alkylene group having 1 to 6 carbon atoms, $R_3$ and $R_4$, each represent a hydrogen atom or an alkyl group having 1 to 20 carbon atoms, and n and n1 are each 2 to 10,000.

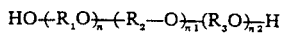

wherein $R_1$, $R_2$ and $R_3$ each represent an alkylene group having 1 to 6 carbon atoms, and n, n1 and n2 are each 2 to 100,000.

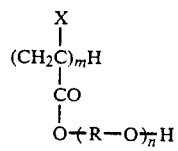

wherein R represents an alkylene group having 1 to 6 carbon atoms, n=10 to 200,000, m=10 to 100,000, X represents a hydrogen atom, a methyl group or a halogen atom.

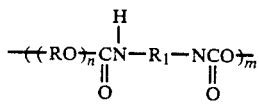

wherein R represents an alkylene group having 1 to 6 carbon atoms, n=10 to 100,000, R1 represents an alkylene group having 1 to 18 carbon atoms, a cyclohexylene group, a phenylene group, a biphenylene group or a toluilene group, and m=10 to 10,000.

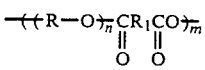

wherein R represents an alkylene group having 1 to 6 carbons, n=10 to 100,000, R₁ represents an alkylene group having 1 to 18 carbon atoms, a cyclohexylene group, a phenylene group, a biphenylene group, a terphenylene group or a toluilene group, and m=10 to 10,000.

Usable as the compound having a large molecular nonlinear optical function, used by mixing it in the polyoxyalkylene matrix typified by the above, are monosubstituted benzene derivatives, trisubstituted benzene derivatives, tetrasubstituted benzene derivatives, monosubstituted biphenyl derivatives, disubstituted biphenyl derivatives, trisubstituted biphenyl derivatives, tetrasubstituted biphenyl derivatives, monosubstituted naphthalene derivatives, disubstituted naphthalene derivatives, trisubstituted naphthalene derivatives, tetrasubstituted naphthalene derivatives, monosubstituted pyridine derivatives, disubstituted pyridine derivatives, trisubstituted pyridine derivatives, tetrasubstituted pyridine derivatives, monosubstituted pyrazine derivatives, disubstituted pyrazine derivatives, trisubstituted pyrazine derivatives, tetrasubstituted pyrazine derivatives, monosubstituted pyrimidine derivatives, disubstituted pyrimidine derivatives, trisubstituted pyrimidine derivatives, tetrasubstituted pyrimidine derivatives, monosubstituted azulene derivatives, disubstituted azulene derivatives, trisubstituted azulene derivatives, tetrasubstituted azulene derivatives, monosubstituted pyrrole derivatives, disubstituted pyrrole derivatives, trisubstituted pyrrole derivatives, tetrasubstituted pyrrole derivatives, monosubstituted thiophene derivatives, disubstituted thiophene derivatives, trisubstituted thiophene derivatives, tetrasubstituted thiophene derivatives, monosubstituted furan derivatives, disubstituted furan derivatives, trisubstituted furan derivatives, tetrasubstituted furan derivatives, monosubstituted pyrylium salt derivatives, disubstituted pyrylium salt derivatives, trisubstituted pyrylium salt derivatives, tetrasubstituted pyrylium salt derivatives, monosubstituted quinoline derivatives, disubstituted quinoline derivatives, trisubstituted quinoline derivatives, tetrasubstituted quinoline derivatives, monosubstituted pyrydazine derivatives, disubstituted pyrydazine derivatives, trisubstituted pyrydazine derivatives, tetrasubstituted pyrydazine derivatives, monosubstituted triazine derivatives, disubstituted triazine derivatives, trisubstituted triazine derivatives, monosubstituted tetrazine derivatives, disubstituted tetrazine derivatives, monosubstituted anthracene derivatives, disubstituted anthracene derivatives, trisubstituted anthracene derivatives, and tetrasubstituted anthracene derivatives.

These compounds have an electrondonative substituent, which more specifically includes an amino group, an alkyl group such as methyl, ethyl, isopropyl, n-propyl, n-butyl, t-butyl, sec-butyl, n-octyl, t-octyl, n-hexyl or cyclohexyl, an alkoxy group such as methoxy, ethoxy, propoxy or butoxy, an alkylamino group such as N-methylamino, N-ethylamino, N-propylamino or N-butylamino, a hydroxyalkylamino group such as N-hydroxymethylamino, N-(2-hydroxyethyl)amino, N-(2-hydroxypropyl)amino, N-(3-hydroxypropyl)amino or N-(4-hydroxybutyl)amino, a dialkylamino group such as N,N-dimethylamino, N,N-diethylamino, N,N-dipropylamino, N,N-dibutylamino, N-methyl-N-ethylamino or N-methyl-N-propylamino, a N-methylamino, N-hydroxymethyl-N-ethylamino, N-(2-hydroxyethyl)-N-methylamino, N-(2-hydroxyethyl)-N-ethylamino, N-(3-hydroxypropyl)-N-methylamino, N-(2-hydroxypropyl)-N-ethylamino or N-(4-hydroxybutyl)-N-butylamino, a dihydroxyalkylamino group such as N,N-dihydroxymethylamino, N,N-di-(2-hydroxyethyl)amino, N,N-di-(2-hydroxypropyl)amino, N,N-di-(3-hydroxypropyl)amino or N-hydroxylmethyl-N-(2-hydroxyethyl)amino, a mercapto group, a hydroxyl group, or a hydrogen atom. These compounds have also an electron attractive substituent, which more specifically includes a nitro group, a cyano group, a halogen atom such as a chlorine atom or a bromine atom, a trifluormethyl group, a carboxyl group, a carboxyester group, a carbonyl group, or a sulfonyl group.

Nonlinear optical elements which are the polymeric compositions containing such compounds are soluble in solvents such as acetonitrile and benzene, and thus can be formed into films or coated with excellency.

For making laser beams incident on the above nonlinear optical elements to carry out the wavelength conversion by nonlinear optical effect, phase adjustment must be carried out so that the fundamental laser beam made incident may not interfere with the wavelength-converted beam to cause attenuation. Methods of carrying out the phase adjustment include those shown below, from which any suited method may be selected depending on the forms of devices.

(i) Anisotropy of refractive index is used in regard to monocrystalline or bulk materials.

(ii) Difference in the mode is used in regard to optical fibers or optical waveguides.

(iii) Cerenkov radiation is used in regard to optical fibers or optical waveguides.

(iv) In regard to, for example, monoaxial crystalline or monoaxial bulk materials in which twodimensional phase adjustment is used in thin film devices, it is possible to make the phase adjustment by use of the anisotropy of refractive index.

Assuming that the direction made with respect to the optical major axis is $\theta n$, the refractive index with respect to ordinary rays is $n^o$, and the refractive index with respect to extraordinary rays is $n^e$, the phase adjustment is possible when either of the following formulae (3) and (4) is satisfied, provided that $n^e < n^o$ in the optical second harmonic generation.

$$n_{2\omega}^e(\theta n) = n_\omega^o \qquad (3)$$

$$n_{2\omega}^e(\theta n) = \tfrac{1}{2}[n_\omega^e(\theta n) + n_\omega^o] \qquad (4)$$

In regard to optical fibers or optical waveguide, the phase adjustment is possible by selecting the film thickness or diameter at which the apparent refractive indexes of TE mode and TM mode agree. In the Cerenkov radiation, a wavelength-converted beam is emitted to the angle $\theta$ at which the phase velocities agree in the frequencies of $\omega$ and $\omega_n$.

The device constituted in the above way performs wavelength conversion of the fundamental laser beam in the conversion efficiency that depends on the laser power density, phase adjustment length, nonlinear susceptibility, etc. In this occasion, it is possible to take out also the fundamental laser beam simultaneously with the wavelength-converted beam, so that the usable laser beams can be made to have multi-wavelengths, thus making it possible to freely select the photosensitive wavelength region of the dry silver salt.

Integrally forming the nonlinear optical device used in the previously described image forming method (I) of the present invention together with the photosensitive material (I), makes it possible to carry out the method (I) of the present invention with greater ease and better efficiency, and moreover makes it possible to make compact an image forming apparatus for working the method (I).

More specifically, in a first preferred embodiment of the photosensitive material of the present invention [hereinafter "the photosensitive material (II)"], the photosensitive material contains a photosensitive and heat-developable element and a polymerizable element, and has a nonlinear optical function.

Here, the photosensitive and heat-developable element has the same definition as that in the above photosensitive material (I), and, in particular, preferred is the element containing the photosensitive silver halide, organic silver salt, and reducing agent. The polymerizable element has also the same definition as that in the above photosensitive material (I), which is the element comprising polymerizable polymer precursor, and preferably the element further containing the photopolymerization initiator or thermopolymerization initiator.

The nonlinear optical function mentioned in the present invention refers to the function by which the second harmonic (SHG beam) can be generated, upon irradiation using a laser, from at least part of the laser beam thereof (the fundamental wave).

Namely, the photosensitive material (II) of the present invention has the function of converting the wavelength of the beam incident on said photosensitive material (II) to $\frac{1}{2}$, $\frac{1}{3}$, etc.

The photosensitive material (II) has the same embodiment as the above photosensitive material (I) in regard to the constituent components, component-mixing ratio, form, etc., except that the above nonlinear optical function has been imparted.

Figure 3:
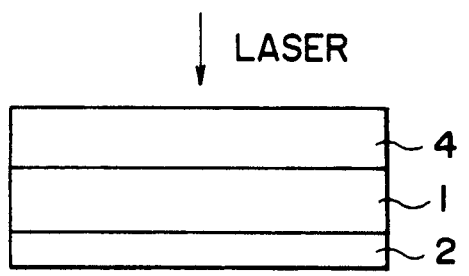
FIGS. 3 to 17 are diagramatical cross sections of photosensitive materials of the present invention.

To impart the nonlinear optical function to the photosensitive material (II) of the present invention, for example, a layer 4, having the nonlinear optical function, may be formed by lamination on a photosensitive layer 1 containing the silver salt, etc., as illustrated in FIG. 3. A compound having the nonlinear optical function (a nonlinear optical function element) may be beforehand contained in the nonlinear optical function layer 4. In this instance, the nonlinear optical function layer has a thickness of from 0.05 μm to 3 mm. However, the present invention is not limited thereto, and, for example, the nonlinear optical function element may also be contained in the above photosensitive layer 1. In that instance, the compound may be contained in the compositional ratio that may not so much impair the sensitivity of the silver salt or the like and can impart the nonlinear optical function to the photosensitive material. The compositional ratio may vary depending on the type of the compound, but the compound (the nonlinear optical function element) may preferably be contained in an mount of from 1 to 500 parts by weight based on 5 parts by weight of the photosensitive and heat-developable element.

Here, as to the compound having the nonlinear optical function, the same compound as the compound contained in the nonlinear optical device used in the image forming method (I) of the present invention can be used.

A method for forming an image by use of the photosensitive material (II) of the present invention [hereinafter "the image forming method (II) of the present invention"] comprises the steps of subjecting the above photosensitive material (II) to imagewise exposure using a laser beam, heating said photosensitive material, and forming a polymer image on said photosensitive material.

Described the image forming method (II) of the present invention in greater detail, the image forming method (II) of the present invention comprises the steps of:

(a) exposing to light the photosensitive material (II) containing at least the photosensitive silver halide, organic silver salt, reducing agent and polymerizable polymer precursor, and the compound having the nonlinear optical function, using a laser beam, to form a latent image comprised of silver metal, with a secondary harmonic (SHG beam) obtained by the compound having the nonlinear optical function;

(b) heating the photosensitive material (II) on which the latent image has been formed, to convert said latent image into a latent image comprised of said reducing agent and the oxidized product produced from said reducing agent by said heating (i.e., a thermal amplification step); and (c) subjecting said photosensitive material (II) having the latent image comprised of said reducing agent and oxidized product, to whole areal exposure or heating to polymerize said polymerizable polymer precursor, corresponding to the distribution of said reducing agent and oxidized product, thereby forming a polymer image.

The laser irradiation in the step (a) in the image forming method (II) of the present invention may be carried out using the same fundametal laser beam and wavelength as those in the image forming method (I) previously described. However, in the case of the photosensitive material (II) in the type of the photosensitive layer and nonlinear optical function layer having been laminated, the laser irradiation may preferably be carried out from the nonlinear optical function layer side.

The heating in the above step (b) may also be carried out under the same conditions as those in the image forming method (I) previously described, and the above steps (a) and (b) may be carried out simultaneously.

The whole areal exposure or the heating in the photopolymerization or the thermopolymerization in the above step (c) may also be carried out under the same conditions as those in the image forming method (I) previously described.

In a second preferred embodiment of the photosensitive material of the present invention [hereinafter "the photosensitive material (III) of the present invention"], the photosensitive material comprises a photosensitive and heat-developable element and a polymerizable element, which photosensitive material further comprises a light-to-heat conversion element. Here, the photosensitive and heat-developable element has the same definition as that in the above photosensitive materials (I) and (II), and, in particular, preferred is the element containing the photosensitive silver halide, organic silver salt, and reducing agent. The polymerizable element has also the same definition as that in the above photosensitive materials (I) and (II), which is the element comprising polymerizable polymer precursor, and preferably the element further containing the photopolymerization initiator or thermopolymerization initiator.

The constitution of the photosensitive material (III) of the present invention will be described below in detail.

Figure 4:
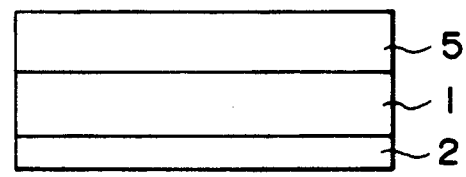

In the photosensitive material (III) of the present invention, the light-to-heat conversion element refers to an element capable of absorbing the light applied by exposure to light to convert it into heat. As reference is made in FIG. 4, the light-to-heat conversion element may be contained in the same layer (a photosensitive layer 1) in which the silver halide or orgainic silver salt is contained, or may be contained in a separated layer 5, which is adjacent to the extent that the converted heat may be satisfactorily conducted to the layer (photosensitive layer 1) comprising the organic silver salt, etc. For example, it may also be contained in the support 2 of the photosensitive material illustrated in FIGS. 1 and 2. In instances where it is incorporated into the same layer 1 in which the silver halide is contained, it is desirable to select an element by which the silver halide is not spectrally sensitized.

The light-to-heat conversion element is not particularly limited so long as it is an element capable of effecting the conversion to heat as described above. As example may be named inorganic metals or organic coloring matters. The organic coloring matters may particularly preferably include organic coloring matters having a light absorption maximum at a wavelength of not less than 600 nm.

In general, the inorganic metals comprise at least one metallic element selected from the elementary group consisting of Ib, IIb, IIIb, IVb, Vb and VIb groups in the periodic table. As example may be named, Sn, Sb, Pb, Bi, As, Zn, Cd, In, Au, Al, Cu, Te and Cr, and besides these, Te-Se compounds or Te-C compounds, incorporated with Se or C, and carbon black.

The organic coloring matters may include, for example, polymethine dyes, azulene dyes, merocyanine dyes, cyanine dyes, Rhodamin dyes, naphthoquinone dyes, pyrylium dyes, phthalocyanie dyes, naphthalocyanine dyes, fluorene dyes, trialrylamine dyes, triarylaminium dyes, triaryldiimonium dyes, and azo dyes, and besides these, also may include metal chelate compounds.

The polymethin dyes include, for example, 1,3-bis(p-diethylaminophenyl)propenium 1,1,3,3-tetrakis(p-diethylaminophenyl)propenium 1,1,3,3-tetrakis(p-diethylaminophenyl)propenium bromide, 1,1,3,3-tetrakis(p-morpholinophenyl)propenium chloride, 1,3-bis(p-diethylaminophenyl)-2-methylpropenium perchlorate, 1,2,3-tris(p-diethylaminostyryl)carbonium tetrafluoroborate, 1,3-bis(p-diethylaminophenyl)-1-(p-tolyl)propenium tosylate, 1,1,5,5-tetrakis(p-diethylaminophenyl)pentadienium perchlorate, 1,1,5,5-tetrakis(p-diethylaminophenyl)pentadienium iodide, 1,5-bis(p-diethylaminophenyl)-1,5-diphenylpentadienium bromide, 1,5-bis(p-dimethylaminophenyl)-1,5-bis(p-anisil)pentadienium arsenic hexafluoride, 1-[γ-(p-dimethylaminophenyl)propenylidene]-guaiazulenium iodide, and 1,1,5,5-tetrakis(p-diethylaminophenyl)-3-methylpentadienium iodide.

The azulene dyes include, for example, 1,3-bis(-guaiazulenyl)propenium, perchlorate, 1,3-bis(6'-t-butylazulenyl)propenium iodide, 1,5-bis(guaiazulenyl)-pendadienium iodide, and 1-guaiazulenyl-5-(6'-t-butylazulenyl)pentadienium perchlorate.

The cyanine dyes include, for example, 1,1'-3,3,3',3'-hexamethyl-2,2'-indocarbocyanine iodide, 1,1',3,3,3',3'-hexamethyl-2,2'-indodicarbocyanine perchlorate, 1,1',3,3,3',3'-hexamethyl-2,2'-tricarbocyanine tetrafluoroborate, 1,1'-diethyl-3,3,3',3'-tetramethyl-2,2'-indodicarbocyanine bromide, 1,1'-dipropyl-3,3,3',3'-tetramethyl-2,2'-indodicarbocyanine chloride, 1,1'-diethoxyethyl-3,3,3',3'tetramethyl-2,2'-indodicarbocyanine iodide, [{3-(1,3,3-trimethyl-2-indolidene)methylidene}-2-chloro-1-cyclopent-1-yl]-methylidene-1,3,3,-trimethyl-2-indolium perchlorate, [(3-ethyl-benzo-1-thiazolidene)methylidene-2-chloro-1-cyclopent-1-yl]methylidene-3-ethylbenzo-1-thiazolium perchlorate, 3,3'-diethyl-2,2'-thiacyanine perchlorate, 3,3'-diethyl-2,2'-thiacarbocyanine tetrafluoroborate, 3,3'-diethyl-2,2'-thiadicarbocyanine tosylate, and (1-methyl-4-quinolino)-(1,3,3-trimethyl-3H-1,7-diaza-2-indene)-trimethinecyanine perchlorate.

The merocyanine dyes include, for example, 3-ethyl-5-[4-(3-ethyl-2-benzothiazolylidene)-2-hexenylidene]rhodanine, and 2-[{3-ethyl-4-oxo-5-(1-ethyl-4-quinolinylidene)ethylidene-2-thiazolinylidene}methyl]-3-ethylbenzoxyazolium bromide.

The Rhodamine dyes include, for example, trimethylrhodamine perchlorate, and Rhodamine B.

The naphthoquinone dyes include, for example, 5,8-bis(methylamino)-1,4-naphthoquinone, 2,3-diamino-5-amino-1,4-naphthoquinone, and 2,3-dicyano-5,8-bis(-butylamino)-1,4-naphthoquinone.

Pyrylium dyes include, for example, 2,6-diphenyl-4-[3-(1,3,3-trimethyl-2,3-dihydro-1H-indol-2-ylidene)-1-pentenyl]thiopyrylium perchlolate, and 2,6-diphenyl-4-[3-(1,3,3-trimethyl-2,3-dihydro-1H-indol-2-ylidene)-1-pentenyl]selenapyrylium perchlolate.

Fluorenon dyes include, for example, 3,6-bis(diethylamino)-9-phenylfluorenium bromide, and 3,6-bis(dipropylamino)-9-(p-dipropylaminophenyl)fluorenium iodide.

The azo dyes include, for example, 4,(5'-nitro-2'-thiazolylazo)-diethylaniline, 2-(4'-dimethylaminophenylazo)-N-methylbenzothiazolium iodide, and 4-phenylazo-4'-dimethylaminoazobenzene.

The metal chelate compounds include, for example, bis(4-diethylaminodithiobenzyl) nickel, bis(4,4'-dimethoxydithiobenzyl) nickel, bis(4,4'-dichlorodithiobenzyl) nickel, and bis(4-methoxy-1,2-dithiophenyl) nickel. Of these dyes, dyes having a maxinum abrorptive wavelength of 600 nm or more may be suitably used for a semiconductor laser.

The photosensitive material (III) of the present invention has the same embodiment as the above photosensitive material (I) in regard to the constitutional components, component mixing ratio, form, etc., except that the above light-to-heat conversion element is contained in the same layer (photosensitive layer) in which the photosensitive silver halide or organic silver salt is contained or that the layer containing the above light-to-heat conversion element is laminated on the photosensitive layer. However, in the instance where the light-to-heat conversion element is incorporated into the photosensitive layer, the light-to-heat conversion element should preferably be contained in an amount of from 1 part to 100 parts, and more preferably from 3 parts to 30 parts, based on 100 parts by weight of the sum total of the silver halide, organic silver salt, reducing agent, polymerizable polymer precursor, and binder optionally contained.

In the instance where the light-to-heat conversion element is incorporated into other layer than the photosensitive layer, the light-to-heat conversion element layer may have a layer thickness of from 0.005 μm to 1 mm, and preferably from 0.05 μm to 500 μm, and the light-to-heat conversion element may also be contained in the support. In this instance, the photosensitive layer has a layer thickness of from 0.005 μm to 2 mm.

The photosensitive material (III) of the present invention, which contains the light-to-heat conversion element, is feasible for an image forming method comprising the following steps (i) to (iii) [hereinafter "image forming method (III) of the present invention"].

(i) The step of subjecting the photosensitive material (III) to desired imagewise exposure to generate silver metal from the silver halide present at the exposed area;

(ii) the step of subjecting the photosensitive material (III) in which the silver metal has been generated, to exposure to light having the wavelength the light-to-heat conversion element can absorb, to cause the light-to-heat conversion element to liberate heat, and carring out thermal amplification by the heat (The thermal amplification refers to the step of causing oxidation-reduction reaction between the organic silver salt and reducing agent with the silver metal serving as a catalyst so that the reaction may cause metallic silver to grow (i.e., amplification) at the area in which the silver metal exists); and (iii) the step of polymerizing the polymerizable polymer precursor contained in the photosensitive material (III), by whole areal exposure or heating to form a polymer image.

As described above, employment of the photosensitive material (III) of the present invention enables, as an embodiment thereof, all of (i) imagewise exposure, (ii) thermal amplification and (iii) polymerization, necessary for the image formation, to be carried out by exposure to light. Hence, it is possible to form an image by using a recording unit having only an exposure means (having no heating means). It is further possible to continuously carry out the steps (i) to (iii), so that the image can be formed in a shorter time. Particularly, the steps (i) to (ii) may be carried out simultaneously. Incidentally, conventional photosensitive materials have no light-to-heat conversion element, and therefore it has been impossible to carry out the thermal amplification in the step (ii) by exposure to light.

The exposure to light in the steps (i) and (ii) in the above image forming method (III) may each be carried out in some cases by using beams with the same wavelength, which is light selected from wavelengths of from 300 nm to 1,300 nm, but preferably by using beams with different kind of two wavelengths.

The imagewise exposure in the step (i) described above is carried out under conditions of an energy up to 1 mJ/cm$^2$ at maximum, using the light with a wavelength to which the silver halide has a sensitivity, as exemplified by light of 400 nm or less in the case when the silver halide comprises silver chloride and has not been sensitized, light of 450 nm or less in the case when the silver halide comprises silver bromide and has not been sensitized, light of 480 nm or less in the case when the silver halide comprises silver iodobromide and has not been sensitized, and light within the sensitizing region in the case when the silver halide has been sensitized (e.g. light having a wavelength up to about 1,000 nm when it has been infrared-sensitized).

The exposure to light in the above step (ii) may preferably be carried out under conditions in which light with wavelengths which the light-to-heat conversion element can absorb and to which silver halide has no photosensitivity is used by making selection, or the exposure to light therein is carried out through a filter layer by which the light to which the silver halide has photosensitivity is cut. More preferably, the second harmonic (SHG beam) obtained by using laser beams and the nonlinear optical device is utilized in the imagewise exposure in step (i) and the fundamental wave thereof is utilized as a heat source for the thermal amplification in step (ii).

The whole areal exposure or heating in the above step (iii) is carried out under the same conditions as those in the image forming method (I) previously described.

The reason why the SHG beam and its fundamental wave are preferably used is that, in particular, the recoding unit can be made compact and the image forming time can be shortened. However, the reason is not limited only thereto, and, since the imagewise exposure is carried out using the SHG beam, no optical sensitization is required for the photosensitive material even when long wavelength lasers such as semiconductor lasers are used as light sources, or optical sensitization applied simply and to the extent that the storage stability may not be affected is sufficient for it, and the writing can be made with high details because the light with short wavelength is utilized.

The photosensitive material (III) used in the image forming method (III) of the present invention also contains the reducing agent represented by the above Formula (I) to (IV), so that it is possible to obtain a polymer image with a sufficiently good contrast even in writing a highly detailed image by use of the SHG beam.

Figure 5:
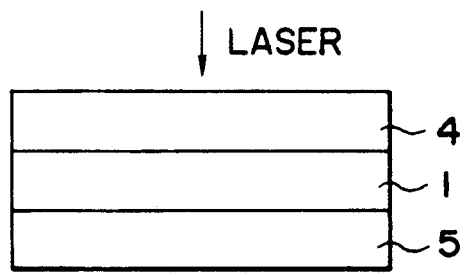

The nonlinear optical function layer may also be integrally formed with the photosensitive material (III) as in the photosensitive material (II) of the present invention (FIG. 5).

The polymer images formed according to the above methods (I) to (III) of the present invention can be utilized as press-plates by themselves. Utilizing the difference in adhesion between the polymerized and unpolymerized areas, color images corresponding to the polymer images can also be obtained by a method in which an image is separated onto an image receiving sheet by peeling-apart, a method in which a toner is adhered to the unpolymerized area by toning, or a method in which dyes or pigments previously incorporated into an image forming medium are diffusion-transferred or sublimation-transferred. It is also possible to obtain a full-color image by using three photosensitive materials for yellow, magenta and cyan.

In a further, third preferred embodiment of the photosensitive material of the present invention [hereinafter "the photosensitive material (IV) of the present invention"], the photosensitive material comprises a photosensitive and heat-developable element and a light-to-heat conversion element.

Namely, the photosensitive material (IV) is a photosensitive material corresponding to the photosensitive material (III) but containing no polymerizable element, and is a photosensitive material useful as an optical recording medium of a DRAW (direct read after write) type or ROM (read only memory) type.

The constitution of the photosensitive material (IV) of the present invention will be described below in detail.

In the photosensitive material (IV), the photosensitive silver salt and the reducing agent (hereinafter generically called the photosensitive and heat-developable element) and also the light-to-heat conversion element may be contained in the same layer, or may be contained in different layers. In particular, on account of the reproduction durability, the above elements may preferably be incorporated into different layers because of the unstableness of dry silver salts to heat, and, for example, a layer comprising the photosensitive and heat-developable element (hereinafter "photosensitive layer") and a light-to-heat conversion element layer (hereinafter "LHC layer") may be provided contiguously or through an intermediate layer.

The LHC layer plays a role of converting light into heat energy, and also is necessary for the read-out by reflection of light and the control of tracking. As materials that can satisfy these requirements, there can be used the same inorganic metals or organic coloring matters as the light-to-heat conversion element used in the above photosensitive material (III), which have a light absorption maximum at a wavelength of not less than 600 nm, and those capable of absorbing and reflecting laser beams or the like which orrespond to the read-out light may suffice for the purpose.

These organic coloring matters are described in Japanese Patent Application Laid-open No. 58-173696, No. 58-194595, No. 58-219091, etc., where they are applied as optical recording mediums. These can also be formed as thin films according to known methods such as vapor deposition, sputtering, spin-coating, dipping, blade coating, and gravure printing.

The photosensitive layer contains the photosensitive silver salt and reducing agent as essential components.

The photosensitive silver salt includes silver halides and organic silver salts, which may be used alone but may preferably be used in combination. The silver halides and organic silver salts that can be used in the present embodiment may be the same as those used in the photosensitive material (I) previously described.

Utilizable as the reducing agent that can be used in the photosensitive material (IV) of the present invention are those commonly used as developing agents in silver emulsions, such as phenols, hydroquinones, catechols, p-aminophenols, p-substituted aminophenols, p-phenylenediamines and 3-pyrazolidones, as well as resorcins, m-aminophenols, m-phenylenediamines, 5-pyrazolones, alkylphenols, alkoxyphenols, naphthols, aminonaphthols, naphthalenediols, alkoxynaphthols, hydrazines, hydrazones, hydroxychroman, hydroxycoumaran, sulfonamidophenols, aminonaphthols, ascorbic acids, hydroxyindanes, and orthobisphenols.

In addition to these photosensitive silver salts or reducing agents, binders, toning agents, antifoggants, etc. can be optionally added in the photosensitive layer.

As binders, the same as the previously described photosensitive material (I) of the present invention can be used as suitable binders in the photosensitive material (IV) of the present invention.

The toning agents include cyclic imides such as urasil, N-hydroxynaphthalimide, phthalimide and succinimide, mercapto compounds, oxazinediones or thiazinediones, phthalazindiones, and phthalazinones.

The antifoggants include perchlorates, peroxides, persulfates, mercury compounds, N-halogeno compounds, sulfinic acids or thiosulfinic acids, lithium carboxylate, sulfur-containing compounds such as disulfides and thiols, and acids such as tetrachlorophthalic anhydride.

Addition in the photosensitive layer, of sulfur-containing compounds such as azole thioethers or blocked azole thiones, tetrazolylthio compounds, and 4-aryl-1-carbamoyl-2-tetrazoline-5-thione makes the layer stabile to light and heat.

Besides these, solid solvents, surface active agents, antistatic agents, etc. can be optionally added.

The photosensitive and heat-developable element has the property that a latent image comprised of silver metal is formed when the photosensitive silver salt is exposed to light, and the silver metal serves as a catalyst upon heating, causing the oxidation-reduction reaction to produce a silver image.

In this invention, the difference in transmittance or reflectance ascribable to the silver image thus formed is read out as a recording signal.

The photosensitive material (IV) of the present invention is utilized, for example, by laminating it on a disc-like or card-like support. Used as substrate materials to constitute the support are glass, polyamide, polyester, polyolefin, polycarbonate, epoxy, polyimide, and polymethyl methacrylate. The substrate usually has grooves thereon for the purpose of tracking, and may also have a subbing layer further thereon for the purpose of enhancing adhesion to the photosensitive layer or improving solvent resistance.

The photosensitive layer may be provided directly on the light-to-heat conversion element layer (LHC layer) provided on the support, but can also be provided interposing an intermediate layer. The intermediate layer is provided for the purposes of improving film forming properties of the photosensitive layer, imparting solvent resistance of the LHC layer, preventing fusion between the LHC layer and photosensitive layer, and preventing deformation of the LHC layer.

Figure 6:
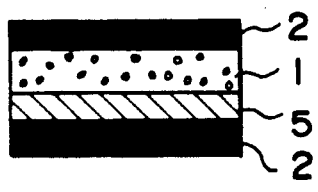
Figure 10:
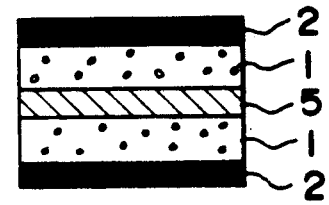
Figure 7:
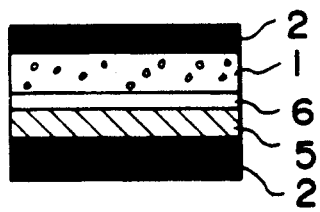
Figure 11:
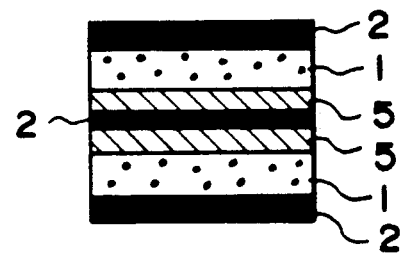
Figure 8:
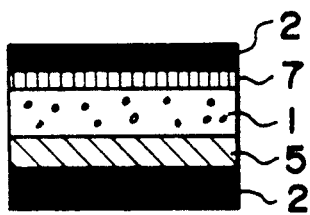
Figure 12:
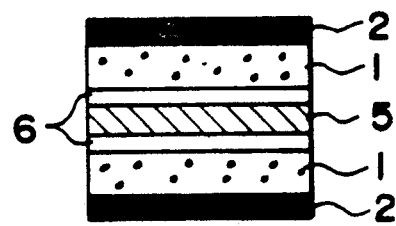
Figure 9:
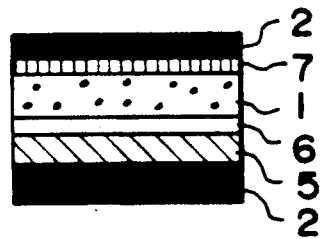
Figure 13:
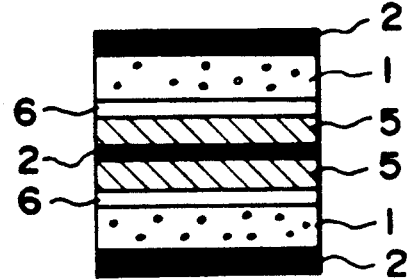
Figure 14:
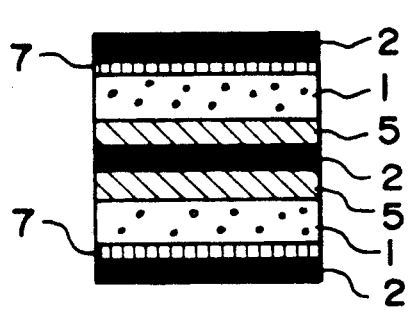
Figure 15:
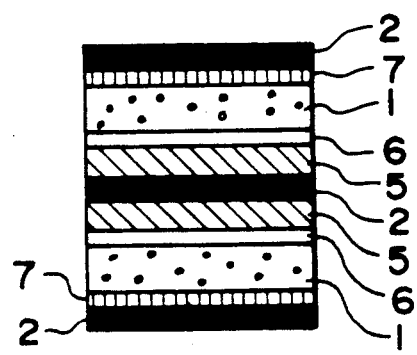

Various embodiments of the layer constitution in the photosensitive material (IV) of the present invention are shown in FIGS. 6 to 15. FIG. 6 shows an embodiment in which an LHC layer 5 and a photosensitive layer 1 are held between supports 2, where the grooves may preferably be formed between the LHC layer and a support. Each support 2 may be comprised of different materials without any difficulty. FIG. 7 shows the structure that the LHC layer 5 and the photosensitive layer 1 interpose an intermediate layer 6. FIG. 8 shows an embodiment in which a protective layer 7 is provided between the photosensitive layer 1 and a support 2. FIG. 9 shows the structure that the protective layer 7 is provided in the embodiment of FIG. 7. The embodiments of FIGS. 6 to 9 are concerned with one-side recording, and those of FIGS. 10 to 15 are embodiments in which these layers are constituted for use in both-side recording. In this instance, both the supports may preferably be made of the like materials.

The photosensitive material (IV) described above in detail does not require to take the hollow structure, and hence can be comprised of supports bonded over the whole areas, bringing about a sufficient strength.

The photosensitive material (IV) of the present invention, which contains the light-to-heat conversion element, enables the information to be written by irradiation with light without using any heating means. More specifically, information can be written by carrying out irradiation with light having the wavelength to which the silver salt shows sensitivity (irradiation with light of a photon mode; specifically, light of from 300 nm to 600 nm), and irradiation with light having the wavelength at which the light-to-heat conversion element has an absorption maximum (irradiation with light of a heat mode; specifically, light of from 600 nm to 1,300 nm). Thus, information can be written using only a light irradiation unit as exemplified by a semiconductor laser.

The writing of information in the photosensitive material (IV) of the present invention can be performed by using a laser beam source that employs a nonlinear optical function element, as exemplified by a second harmonic generation element (hereinafter "SHG element"), and the writing can be performed using a beam with a wavelength not more than that of a commonly available laser beam (a beam of from 300 nm to 450 nm). In this instance, the nonlinear optical function element that can be used may be the same as that used in the image forming method (I) or photosensitive material (II) previously described.

Because of possibles of high density recording, the idea of using the SHG beam in the writing of optical recording has been pointed out since the phenomenon of SHG was discovered in the 1960's, but, because of an insufficient SHG conversion efficiency, this has not yet been realized. However, the photosensitive material (IV) according to the present invention has a sensitivity comparable to conventional silver salts, and hence the writing can be performed with the present SHG conversion efficiency.

However, the writing of information in the photosensitive material (IV) of the present invention is by no means limited to such an example, and, for example, in instances in which the recorded information is not required to be read out in the real time, the recording can also be performed by irradiating the photosensitive material with beams having a photon-mode wavelength, and thereafter heating it by any other means.

Specifically, the writing of information when preparing the ROM mediums of the present invention, as exemplified by CDs and video discs, can be performed by carrying out mask exposure to light from a light source such as a strobe or flash lamp, a tungsten lamp, a mercury lamp, a halogen lamp such as a iodine lamp, a xenon lamp, or a fluorescent lamp, and thereafter heating the photosensitive material at about from 80° C. to about 200° C. for a period of from several seconds to several ten seconds to make a recorded area containing silver, at the exposed area of the layer comprising the photosensitive and heat-developable element.

The recorded information in the photosensitive material (IV) of the present invention, in which the writing has been made in the above way, can be read out by irradiating the photosensitive material with light and reading out the light reflected or transmitted from the light-to-heat conversion element.

Namely, the area at which the metalic silver is deposited and the area at which it is not deposited when the above writing of information is performed are different in the intensity of the light reflected or transmitted from the light-to-heat conversion element, and therefore the recorded information can be read out by detecting the reflected light or transmitted light.

The read-out carried out using the reflected light further enables easy control of the tracking.

It is also preferable to make different the wavelengths of the writing light and read-out light so that the read-out light may not cause any heat accumulation or response of silver salt in the photosensitive material. Since, in general, the photosensitive silver salt made to have a sensitivity at the long wavelength side by optical sensitization has also a sensitivity to the wavelength prior to sensitization, the read-out light may preferably have a longer wavelength than the writing light.

An image forming method that employs the photosensitive material (IV) of the present invention [hereinafter "the image forming method (IV) of the present invention"] will be described below in detail.

The image forming method (IV) of the present invention is carried out as follows:

In the instance where, for example, the photosensitive material having the structure as shown in FIG. 6 is used, irradiating the photosensitive material by writing light results in silver metal produced on the silver halide contained in the photosensitive layer 1, and the photosensitive layer 1 is heated by heating or liberation of heat as a result of absorption of light in the LHC layer 5, so that the oxidation-reduction reaction proceeds at the silver metal area to produce silver, which forms a silver spot (or a recorded area). The silver spot tends to turn black, though having a different absorption wavelength depending on the type of the toning agent, and hence the amount of the reflected light of the read-out light from the LHC layer at the silver spot area decreases when the photosensitive material is irradiated by read-out light. Thus, the recorded information can be read out according to the difference in the amount of reflected light between the exposed area (silver spot) and unexposed area.

Figure 16:
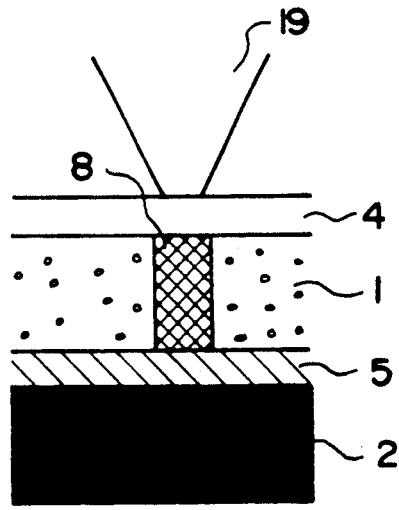
Figure 17:
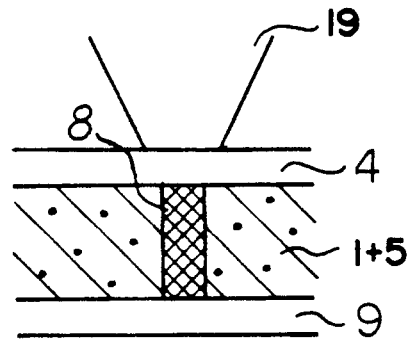

As an example for the instance where images are formed by utilizing the nonlinear optical effect described later, the recording can also be performed, for example, by the use of the layer constitution that a layer 4 comprising the nonlinear optical function element is provided in the photosensitive material, as illustrated in FIGS. 16 to 17. In these figures, the numeral 8 denotes a recorded area, 9 a reflective layer, and 19 a laser beam. In this instance, a layer which is sensitive to a wavelength of ½ or ⅓ of the light and not sensitive to the laser beam itself may preferably be used as the photosensitive layer 1. A laser beam made to have a high power results in an increase in the wavelength conversion efficiency in the secondary or tertiary nonlinear optical effect in the nonlinear optical function layer 4, to give rise to formation of silver metal in the photosensitive layer 1. At the same time, the laser beam is absorbed at the LHC layer 5 and converted into heat, so that the oxidation-reduction reaction takes place, with the above silver metal serving as a catalyst, and thus forming the silver spot in the same way as above.

Here, the fundamental laser beam, wavelength thereof, and wavelength of SHG beam in the laser irradiation may be the same as those in the previously described image forming method (I) of the present invention.

An example of the recording unit for carrying out the exposure to light in the methods (I), (III) and (IV) of the present invention will be shown below.

Figure 18:
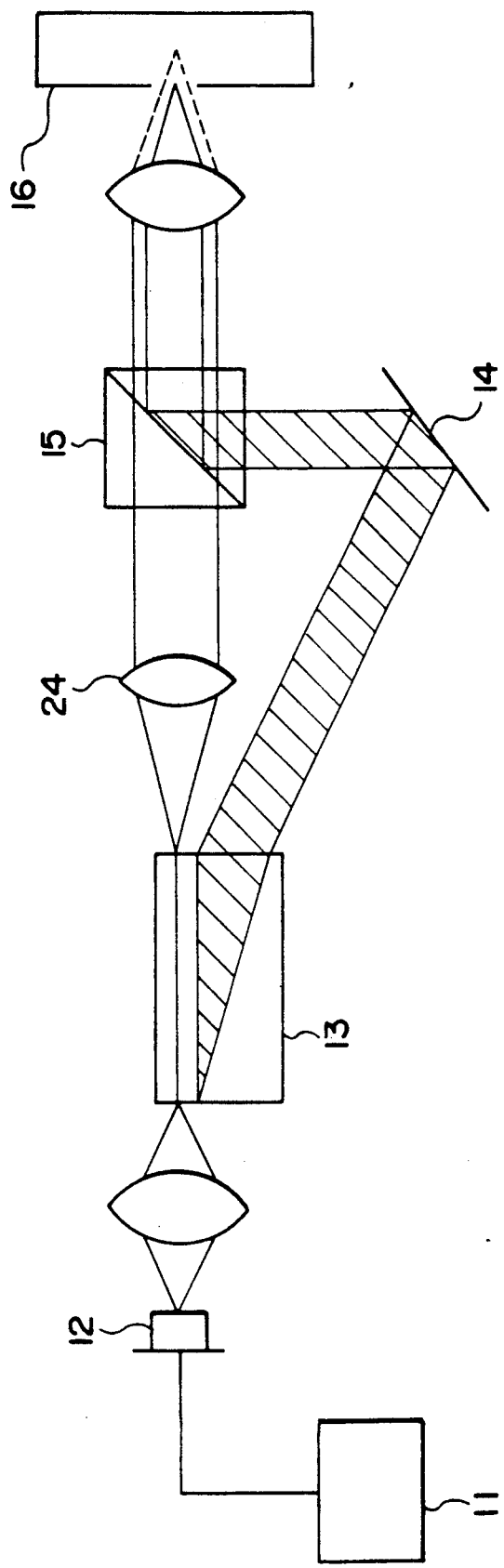
FIGS. 18 and 19 are diagramtical views to illustrate imagewise exposure steps in the method of the present invention.

FIG. 18 is a diagramatical view to illustrate an example of the constitution of the recording unit for making irradiation with the SHG beam and the fundamental wave thereof. In this unit, a laser beam is oscillated from a semiconductor laser 12 while being modulated by means of a modulated signal generator 11, the laser beam is made incident on a nonlinear optical device 13 of a thin film waveguide type to generate an SHG beam, the SHG beam is reflected on a mirror 14, whose optical axis is adjusted to that of the fundamental wave beam using a dichroic mirror 15, and thus digital exposure is made on a photosensitive material 16. Though not shown in the drawing, the photosensitive material 16 is in the form of a rotating drum. Also, in this unit, the optical axis of the SHG beam is adjusted to that of the fundamental wave, but may not necessarily be adjusted.

Figure 19:
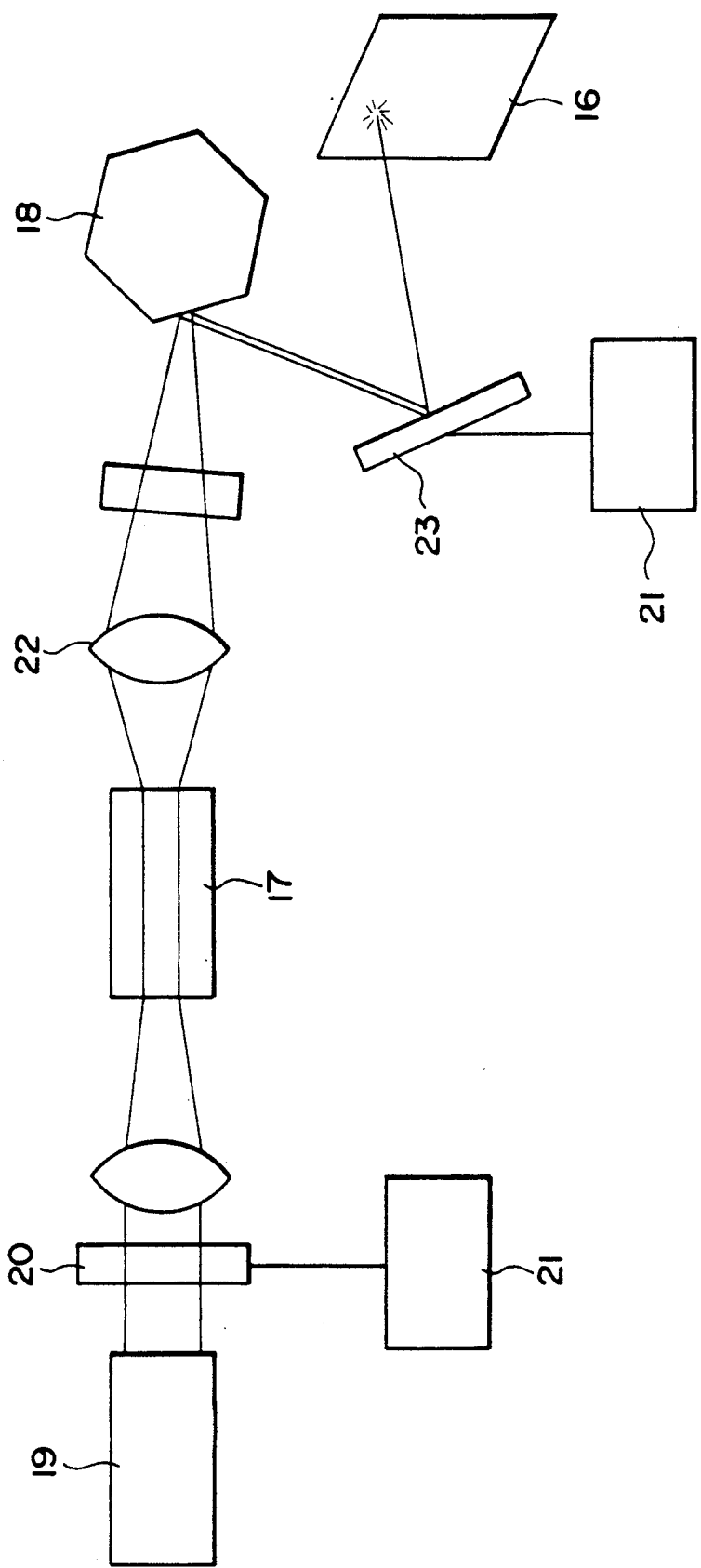
Figure 20:
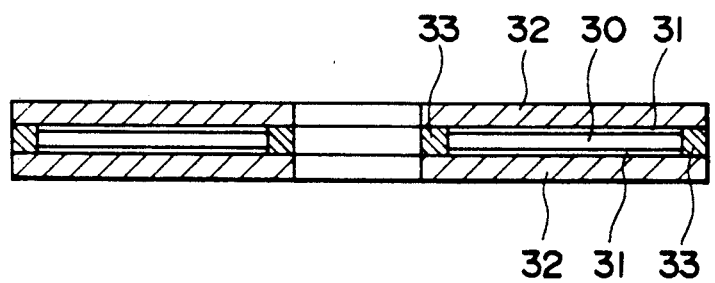
FIG. 20 is a diagramatical cross section of a conventional optical recording medium having a hollow structure.

FIG. 19 is a diagramatical view to illustrate another example of the constitution of the recording unit, which is a unit in which a beam is scanned with a polygonal mirror 18 by using a nonlinear optical device formed into an optical fiber. In FIG. 19, the numeral 19 denotes a laser beam source; 20, a laser beam modulator; 21, a modulated signal generator; 22, an f·θ lens; and 23, a vibration-mirror.

For the purpose of protecting with time the silver image formed by the image forming method (IV) employing the photosensitive material (IV) of the present invention, described above in detail, it is particularly preferred to laminate on said photosensitive material a film comprising a compound capable of inhibiting the oxidation-reduction reaction between the photosensitive silver salt and reducing agent remaining in the photosensitive material after the image has been formed.

The "film comprising a compound ..." mentioned in the present invention means, for example, a film comprising the compound supported on its surface, and a film comprising the compound contained in its inside. More specifically, such a film is a film having the constitution that enables inhibition of the reaction between the organic silver salt and reducing agent, caused by said compound in the photosensitive layer.

The above compound capable of inhibiting the oxidation-reduction reaction will first be described in detail.

The above film is a film comprising a compound capable of inhibiting the oxidation-reduction reaction between the organic silver salt and reducing agent (hereinafter simply "inhibitory compound"), and is used to be laminated on the photosensitive layer after information has been written in it. Lamination of this film on the photosensitive layer causes the inhibitory compound possessed by the film, to be impregnated and moved into the photosensitive layer, so that the silver salt and reducing agent remaining inside the recording layer can be reacted with difficulty, and therefore the information written in the recording layer can have a superior stability with time.

In particular, compared with methods in which the inhibitory compound is fed to the photosensitive layer merely by coating or the like, the present invention has the advantages that it has a superior recording sensitivity, the inhibitory compound is evaporated with difficulty, the film is also effective as a protective layer of the photosensitive layer, the photosensitive layer is scratched with difficulty although the photosensitive layer is scratched when the inhibitory compound is fed to the photosensitive layer by direct coating or the like, and the operation can be made with ease since no solvent may be used in contrast to the direct coating or the like.

The inhibitory compound includes compounds capable of inhibiting the oxidation-reduction reaction between the organic silver salt and photosensitive agent, and may not particularly be limited so long as they are compounds capable of being moved from the surface or inside of the film to the recording layer. They may be used by appropriately selecting suitable compounds, depending on the type of the organic silver salt and reducing agent or the purpose for which the photosensitive material is used. They, for example, may be compounds capable of inhibiting the oxidation-reduction reaction itself, or, for example, may be compounds capable of converting the organic silver salt or the like in the photosensitive layer into a stable silver salt of a different type. Such compounds include, for example, halogen compounds, mercaptotetrathiazoles, glutathione, mercaptopyrimidines, 1-phenyl-2-tetrazoline-5-thiones, benzenesulfines, benzenethiosulfones, sulfoxides, benzeneselenines, benzothiazoline-2-thiones, mercaptotriazines, mercaptooxadiazoles, isothioureas, isothiouroniums, mercaptobenzoic acids, and mercaptoimidazoles. In more detail, they include, for example, N-bromosuccinimide, 1,3,5-tris(trichloromethyl)-triazole, 1,3,5-tris(tribromomethyl)triazole, ethylenethiourea, ethylisothiourea, 2-mercaptobenzimidazole, 2-mercaptobenzoxazole, 5-chloro-2-mercaptobenzothiazole, 1-phenyl-5-mercapto-1H-tetrazole, and 1-phenyl-2-methyl-5-mercapto-1H-1,3,4-triazole, which are preferred examples. These may also be used alone or in combination of two or more.

There are no particular limitations on the film so long as it comprises the above inhibitory compound, can be laminated on the photosensitive layer, and is a film in which the inhibitory compound can be moved to the photosensitive layer after lamination to inhibit the reaction between the silver salt and reducing agent remaining in the photosensitive layer. It may be used by appropriately selecting a preferred film, depending on the purpose for which the photosensitive material is used or the type of the inhibitory compound. It may also be a film comprising the compound supported on its surface or a film comprising the compound contained in its inside, as previously described.

Materials for the film include, for example, thermoplastic resins, thermosetting resins, metal foil, and papers such as art paper, synthetic paper and baryta paper. Since in the photosensitive material the read-out of the recorded information can be most simply carried out when it is performed by irradiating the photosensitive layer with read-out light through the film, the film may preferably be capable of highly transmitting the read-out light. In instances in which the metal foil or the like is used, it is also preferred to perform the read-out using reflected light. The thermoplastic resins include, for example, polyethylene terephthalate, polymethyl methacrylate, and polycarbonate. The thermosetting resins include, for example, phenol resins. The metal foil includes, for example, aluminum foil and copper foil.

The film may desirably have a thickness such that the read-out light can sufficiently reach the recording layer through the film, and may preferably have a thickness of from 0.1 µm to 2 mm, and more preferably from 1 µm to 0.5 mm.

When taking the embodiment in which the inhibitory compound is supported on the surface of the film, the film may be prepared, for example, by dissolving in a solvent a binder such as polyvinyl butyral, polymethacrylate or polystyrene and the inhibitory compound, and coating the solution on a film.

The present invention will be described below in greater detail by giving Examples. In the following description, "part(s)" is by weight.

EXAMPLE 1

In a darkroom, 0.2 part of 4-methoxynaphthol was dissolved in a solution obtained by dispersing 0.2 part of AgBr and 0.8 part of silver behenate in 10 parts of isopropanol, to prepare Solution A.

On the other hand, as another solution, 0.15 part of 2-chlorothioxanthone, 0.18 part of ethyl p-dimethylaminobenzoate, 0.6 part of polymethyl methacrylate and 1.8 parts of trimethylolpropane triacrylate were dissolved in 15 parts of methyl ethyl ketone to obtain Solution B.

Next, these Solutions A and B were mixed, and coated on a PET (polyethylene terephthalate) film of 48 μm thick so as to give a dried film thickness of 2 μm to provide a photosensitive layer, and then a polyvinyl alcohol (PVA) layer of 2 μm thick was provided on the photosensitive layer, thus completing a photosensitive material (A).

Subsequently, using the recording unit constituted as shown in FIG. 18 (a 830 nm semiconductor laser, 100 mW, an LiNbO$_3$ nonlinear optical device, manufactured by Matsushita Electric Industrial Co., Ltd.), recording was performed with the SHG beam. This photosensitive material (A) was allowed to pass through a thermal amplifier regulated to 95° C., for 10 seconds, and thereafter placed on a hot plate heated to 60° C. to carry out whole areal exposure for 6 seconds with use of a fluorescent lamp having an electric power of 30 W.

Next, after the PVA layer was removed by washing with water, etching was carried out using an ethanol bath. As a result an unexposed area, not exposed of the SHG beam, remained on the substrate.

Here, the spot diameter of the SHG beam was narrowed down to 80 μm × 200 μm, and the photosensitive material (A) was moved at a speed of 1 mm/sec.

EXAMPLE 2

After 3 parts of behenic acid was dissolved in 60 parts of toluene and 60 parts of ethanol, in a dark room 5 parts of silver behenate was added thereto and the mixture was dispersed for 7 minutes at 6,000 rpm using a homomixer. Subsequently 0.7 part of silver bromide and 3 parts of polyvinyl butyral (trade name: Extran BM-1, produced by Sekisui Chemical Co., Ltd.) were added, and stirring was continued for 2 hours. Thereafter, while warming the mixture to 35° C., 0.5 part of adipic acid and 0.8 part of phthalazinone were added thereto, followed by stirring for 30 minutes to obtain Solution A.

On the other hand, as another solution, 0.9 part of Micheler's ketone, 0.4 part of ethyl p-dimethylaminobenzoate, 25 parts of trimethylolpropane triacrylate and 0.6 part of 4-benzyloxynaphthol were added in 40 parts of toluene to obtain Solution B.

Next, these Solutions A and B were mixed, and coated by use of an applicator on a 60 μm thick PET film subjected to TiO$_2$ treatment, so as to give a dried film thickness of 4 μm, to provide a photosensitive layer. Subsequently a PET film of 12 μm thick was laminated on the photosensitive layer to provide a protective layer, thus completing a photosensitive material (B).

On the photosensitive material (B) thus obtained, recording was performed in the same manner as Example 1, and the PET film of 12 μm thick was peeled. As as result, a polymer image corresponding to the unexposed area was formed on the film.

EXAMPLE 3

Example 2 was repeated to prepare a photosensitive material (C), except that a 50 μm thick PET film incorporated with 10% by weight of carbon black was used in place of the 60 μm thick PET film which was subjected to TiO$_2$ treatment and which was used for providing thereon the photosensitive layer (Solution A=-Solution B), and that a PVA layer of 2 μm thick was provided in place of the PET laminate film serving as the protective layer.

Subsequently the laser irradiation was carried out in the same manner as Example 1, and thereafter the whole areal exposure was carried out for 7 seconds using a fluorescent lamp with a fluorescent maximum wavelength of 360 nm and an electric power of 30 W, followed by removal of the PVA layer by washing with water. This was further etched using an ethanol solution. As a result, an image corresponding to the unexposed area, not exposed of the SHG beam, remained on the substrate.

EXAMPLE 4

Example 2 was repeated to prepare a photosensitive material (D), except that a 50 μm thick PET film incorporated with 20% by weight of carbon black was used in place of the 60 μm thick PET film which was subjected to TiO$_2$ treatment and which was used for providing thereon the photosensitive layer (Solution A+-Solution B).

Subsequently the photosensitive material (D) was irradiated with both the SHG beam and fundamental wave by use of the recording unit used in Example 1, so that a colored image was formed on the exposed area. Thereafter, using the fluorescent lamp used in Example 3, the whole areal exposure was carried out for 7 seconds, and then the PET film of 12 μm thick was peeled while heating. As a result, a black image was formed on the film at the unexposed area, not exposed of the SHG beam.

EXAMPLE 5

First, 3 parts of behenic acid was dissolved in 60 parts of toluene, thereafter, in a darkroom, 5 parts of silver behenate were added, and the mixture was dispersed for 7 minutes at 6,000 rpm using a homomixer. Subsequently 0.7 part of silver bromide and 3 parts of polyvinyl butyral (trade name: Extran BM-1, a produced by Sekisui Chemical Co., Ltd.) were added, and stirring was continued for 2 hours. Thereafter, while warming the mixture to 35° C., 0.5 part of adipic acid and 0.8 part of phthalazinone were added thereto, followed by stirring for 30 minutes to obtain Solution A.

On the other hand, as another solution, 0.9 part of Micheler's ketone, 0.4 part of ethyl p-dimethylaminobenzoate, 25 parts of trimethylolpropane acrylate, 0.6 part of 4-methoxynaphthol and 0.005 part of a dye having the following chemical structure were added in 40 parts of toluene to obtain Solution B.

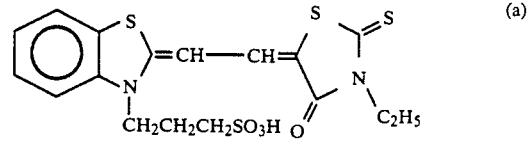

(a)

These Solutions A and B were mixed, and coated on a polyethyleneterephthalate (PET) film, followed by drying to obtain a photosensitive layer of 4 μm thick.

On the other hand, as an additional film, 10 parts of poly-ε-caprolactone and 5 parts of p-nitroaniline were dissolved in 50 parts of benzene, and the solution was coated on a PET film so as to give a film thickness of 15 μm to form a nonlinear optical function film.

Next, this nonlinear optical function film and the above photosensitive layer were overlapped to complete a photosensitive material (E).

This photosensitive material (E) was irradiated on its nonlinear optical function film side, with light converged to a spot diameter of about 2 mm using a YAG laser. Thereafter, the photosensitive material was heated for 8 seconds on a hot plate regulated to 110° C., resulting in the exposed area having turned bluish black.

Subsequently, this was subjected to whole areal exposure from the photosensitive layer side for 3 seconds using an ultra-high pressure mercury lamp. The nonlinear optical function film was peeled away, and the photosensitive layer was etched in ethanol, so that the exposed area, exposed of the the YAG laser, was melted, but the unexposed area was not melted, and thus it was able to obtain a polymer image corresponding to the imagewise exposure.

EXAMPLE 6

Example 5 was repeated to prepare a photosensitive material (F) of the present invention, except that the PET film used for providing thereon the photosensitive layer (Solution A+Solution B) was replaced with a PET film incorporated with 10% by weight of black carbon by kneading. This was subjected to similar exposure to light to in Example 5. Thereafter the nonlinear optical function film was peeled away, a transparent film was laid overlapping, and the whole areal exposure was carried out to obtain similar good results.

EXAMPLE 7

Example 5 was repeated to prepare a photosensitive material (G) of the present invention, except that polyoxyethylene was used in place of polyε-caprolactone and a nonlinear optical function film of 17 μm thick was formed, and the recording was carried out in the like manner to obtain similar good results.

EXAMPLE 8

First, 3 parts of behenic acid was dissolved in 60 parts of toluene, thereafter, in a darkroom, 5 parts of silver behenate were added, and the mixture was dispersed for 7 minutes at 6,000 rpm using a homomixer. Subsequently 0.7 part of silver bromide and 3 parts of polyvinyl butyral (trade name: Extran BM-1, a produced by Sekisui Chemical Co., Ltd.) were added, and stirring was continued for 2 hours. Thereafter, while warming the mixture to 35° C., 0.5 part of adipic acid and 0.8 part of phthalazinone were added thereto, followed by stirring for 30 minutes to obtain Solution A.

On the other hand, as another solution, 0.9 part of Micheler's ketone, 0.4 part of ethyl p-dimethylaminobenzoate, 25 parts of trimethylolpropane triacrylate and 0.6 part of 4-methoxynaphthol were added to 40 parts of toluene to obtain Solution B.

These Solutions A and B were mixed, and coated on a PET (polyethyleneterephthalate) film on which carbon black has been coated at a layer thickness of 10 μm, followed by drying to obtain a photosensitive layer of 4 μm thick, and then a PVA (polyvinyl alcohol) layer of 2 μm thick was provided thereon, thus obtaining a photosensitive material (H) of the present invention.

Using the recording unit constituted as shown in FIG. 18, comprising a semiconductor laser (oscillation wavelength: 830 nm; output: 100 mW and a nonlinear optical device (LiNbO3), manufactured by Matsushita Electric Industrial Co., Ltd.), the photosensitive material (H) thus obtained was irradiated with the SHG beam and fundamental beam (simultaneously). Thereafter, using an ultraviolet exposure machine (USH-500D, manufacture by Ushio Co.), the whole areal exposure was carried out for 4 seconds. After the PVA layer was removed by washing with water, etching was carried out using an ethanol bath. As a result, there imagewise remained an unexposed area, not exposed of the SHG beam.

EXAMPLE 9

In 100 parts of a mixed solvent of n-butanol, diacetone alcohol and dichloroethane (2:2:1), 5 parts of 1,1,5,5-tetrakis(p-diethylaminophenyl)pentadienium iodide and 10 parts of polyvinyl butyral (trade name: BX-1, produced by Sekisui Chemical Co., Ltd.) were dissolved. This solution was coated on a PET film of 25 μm thick, followed by drying to obtain a photosensitive layer of 1 μm thick. On this layer, a PVA layer of less than 1 μm thick was provided. In a darkroom, using the phtosensitive solution prepared in Example 8, a photosensitive layer of 4 μm thick was formed on the PVA layer, and a PVA layer of 2 μm thick was further formed.

Using the same recording unit as Example 8, the photosensitive material (I) thus obtained was irradiated with the SHG beam and fundamental beam. Thereafter, using the same ultraviolet exposure machine as Example 8, the whole areal exposure was carried out for 4 seconds. After the PVA layer was removed by washing with water, etching was carried out using an ethanol bath. As a result, there imagewise remained an unexposed area, not exposed of the SHG beam.

EXAMPLE 10

Example 8 was repeated to prepare Solution B, except that 2 parts of 1,1,5,5-tetrakis(p-diethylaminophenyl)pentadienium iodide was added. This solution B and the same Solution A as in Example 8 were mixed. The resulting dispersion was coated on a PET film followed by drying to obtain a photosensitive layer of 6 μm. A PVA layer of 2 μm thick was formed thereon, thus obtaining a photosensitive material (J) of the present invention.

The photosensitive material (J) thus obtained was subjected to the recording and whole areal exposure in the same manner as Example 8. After the PVA layer was removed by washing with water, etching was carried out using an ethanol bath. As a result, there imagewise remained an unexposed area, not exposed of the SHG beam.

EXAMPLE 11

A mixed solution comprising 9.5 parts of pentaerythritol triacrylate, 12.5 parts of dichloromethane, 75 parts of an aqueous 8% by weight PVA solution and 3.3 parts of an aqueous 5% by weight sodium p-dodecylbenzenesulfonate solution was emulsified at 6,000 rpm for 10 minutes by use of a homomixer. In the resulting emulsion, 1.5 parts of a silver bromide emulsion (7% by weight of gelatin and 10% by weight of silver bromide), 6 parts of a benzotriazole silver emulsion (7% by weight of gelatin and 6.3% by weight of benzotriazole silver), 3 parts of sorbitol and 4 parts of an aqueous 10% by weight gelatin solution were added, stirred, followed by further addition of 29 parts of a methanol solution of 0.8 part of azobisisobutyronitrile, and 0.9 part of 4-methyl- 1-phenyl-3-pyrazolidone, to prepare a photosensitive solution.

Carbon black was mixed into this solution in a concentration of 10% by weight. This mixture was coated on a PET film of 50 μm, followed by drying to obtain a photosensitive layer of 4 μm thick. A PET layer film was laminated thereon, thus obtaining a photosensitive material (K) of the present invention.

The photosensitive material (K) thus obtained was subjected to the recording and whole areal exposure in the same manner as in Example 8. The laminated film was peeled followed by washing with water. As a result, there imagewise remained an exposed area, exposed of the SHG beam.

EXAMPLE 12

Formation of LHC layer

A composition comprising the components shown in Table 1 below was coated by use of an applicator on a polyethylene terephthalate film of 100 μm thick, with a thickness of 0.5 μm, followed by drying.

TABLE 1

| Components | (parts by weight) |
|---|---|
| IR-820 (produced by Nippon Kayaku Co., Ltd) | 2.0 |
| 1,1,5,5-tetrakis(p-diethylaminophenyl)-pentadienium perchlorate | |
| Polymethyl methacrylate | 1.5 |
| Dichloroethane | 50 |

Formation of photosensitive layer

In a darkroom, 3 parts of behenic acid was dissolved in 43 parts of xylene and 40 parts of n-butanol, and thereafter 5 parts of silver behenate was added, which were dispersed by emulsification for 10 minutes using a homogenizer (6,000 rpm). To this dispersion, 0.5 part of silver bromide and 1.5 parts of a methyl methacrylate-dimethylaminoethyl methacrylate copolymer were added, and the mixture was stirred for 3 hours. In the resulting dispersion, 1.0 part of phthalazinone, 3.5 parts of Sumilizer MDP (produced by Sumitomo Chemical Co., Ltd.) and 0.05 part of potassium bromide were added, and stirring was continued for 30 minutes. The dispersion thus prepared was coated on a polyethylene terephthalate film of 100 μm thick, with a thickness of 4 μm.

The LHC layer and photosensitive layer prepared in the above way were laid overlapping each other, and allowed to pass through a heat roller (80° C.) applied with a pressure of 25 kg/cm² to make a laminated product, a photosensitive material (L).

The photosensitive material (L) thus prepared was exposed to light for 1 second using a fluorescent lamp (20 W) having a peak at 360 nm, from the photosensitive layer side, through a mask and with a distance of about 10 cm. Thereafter, the photosensitive material was allowed to pass through a heat development machine regulated to 120° C. Transmittance at 830 nm at the exposed area and unexposed area, and reflectance from the photosensitive layer side were measured using a spectroscope to obtain the results shown in Table 2 below.

TABLE 2

| | Exposed area | Unexposed area |
|---|---|---|
| Transmittance (%) | 1.6 | 3.2 |

TABLE 2-continued

| | Exposed area | Unexposed area |
|---|---|---|
| Reflectance (%) | 15.9 | 23.5 |

As is evident from the transmittance and reflectance shown in Table 2, the recorded information written in the present Example can be read out by reflected light or transmitted light.

EXAMPLE 13

An LHC layer with the composition comprising the components shown in Table 3 below was formed in the same procedures as Example 12.

TABLE 3

| Components | pbw |
|---|---|
| 1-Guaiazulenyl-5-(6'-t-butylazulenyl)-pentadienium perchlorate | 2.0 |
| Polyvinyl butyral | 0.3 |
| Dichloroethane | 45 |

The photosensitive layer and LHC layer were laminated in the same manner as in Example 12 to prepare a photosensitive material (M), and recording was performed thereon. Results obtained by measuring the transmittance and reflectance, at 830 nm, are shown in Table 4 below.

TABLE 4

| | Exposed area | Unexposed area |
|---|---|---|
| Transmittance (%) | 1.9 | 4.0 |
| Reflectance (%) | 15.3 | 31.6 |

As is evident from the transmittance and reflectance shown in Table 2, the recorded information written in the present Example can be read out by reflected light or transmitted light.

EXAMPLE 14

In a darkroom, a subbing layer comprising SiO₂ was formed with a thickness of 200 Å on a 1.2 mm thick polymethyl methacrylate substrate on which grooves were made, and thereafter a 750 Å LHC layer comprising 1,5-bisguaiazulenylpentadienium perchlorate was formed by spin coating. An intermediate layer comprising polyvinyl alcohol was formed thereon with a thickness of 100 to 200 Å.

A photosensitive layer of 5,000 Å thick, having the following composition was further formed by spin coating.

| Composition | pbw |
|---|---|
| Silver chlorobromide | 0.4 |
| Silver behenate | 5.0 |
| Polyvinyl butyral | 5.0 |
| Sumilizer WXR (a product of Sumitomo Chemical) | 4.0 |
| Phthalazinone | 1.2 |

Next, on a polymethyl methacrylate substrate of 0.5 mm thick, the medium prepared in the above was laminated using a hot-melt adhesive (PS-15, produced by ACI Japan Limited) and through means of a hot-melt coater (manufactured by Matsushita Kogyo) to obtain a photosensitive material (N).

The photosensitive material (N) thus prepared was set on the unit constituted as shown in FIG. 18 and having an SHG beam generation switching device, and writing was performed at 450 rpm under a semiconductor laser power of 100 mW and a frequency of 1 MHz, and thereafter changes in reflectance at 830 nm was detected by means of a detector.

The contrast observed at that time was found to be 0.55.

Here, the contrast is expressed by $R=(A-B)/A$, wherein A represents the amount of reflected light before recording, and B, the amount of reflected light after recording.

As is evident from this contrast, the recorded information written in the present Example can be read out by reflected light, etc.

EXAMPLE 15

Formation of LHC layer

A composition comprising the components shown in Table 5 below was coated by use of an applicator on a polyethylene terephthalate film (PET film) of 100 μm thick so as to give a dried film thickness of 0.5 μm, followed by drying.

TABLE 5

| Components | pbw |
| --- | --- |
| 1,1,5,5-Tetrakis(p-diethylaminophenyl)-pentadienium perchlorate (tradename, IR-820; produced by Nippon Kayaku Co.) | 2.0 |
| Polymethyl methacrylate | 1.5 |
| Dichloroethane | 50 |

Formation of photosensitive layer

In a darkroom, 3 parts of behenic acid was dissolved in 40 parts of xylene and 45 parts of n-butanol, and thereafter 5 parts of silver behenate was added, which were dispersed by emulsification for 10 minutes using a homogenizer (6,000 rpm). In this dispersion, 0.5 part of silver bromide and 15 parts of a methyl methacrylate-dimethylaminoethyl methacrylate copolymer were added, and the mixture was stirred for 3 hours. In the resulting dispersion, 1.0 part of phthalazinone, 3.5 parts of Sumilizer MDP (produced by Sumitomo Chemical Co., Ltd.) and 0.05 part of potassium bromide were added, and stirring was continued for 30 minutes. The dispersion thus prepared was coated on a polyethylene terephthalate film of 50 μm thick, with a thickness of 4 μm.

The LHC layer and photosensitive layer prepared in the above way were laid overlapping each other, and allowed to pass through a heat roller (80° C.) applied with a pressure of 25 kg/cm² to make a laminated product, a photosensitive material (O).

Next, the photosensitive layer thereof was exposed to light for 1 second using a fluorescent lamp (20 W) having a peak at 360 nm, through a mask and with a distance of about 10 cm. Thereafter, the photosensitive material was allowed to pass through a heat development machine regulated to 120° C.

Preparation and lamination of inhibitory compound-supporting film

In 50 parts of methanol, 5.0 parts of polyvinyl butyral and 4.0 part of 1-phenyl-5-mercapto-1H-tetrazole as the inhibitory compound were dissolved. The resulting solution was coated on a PET film of 50 μm thick using a Meyer bar so as to give a dried film thickness of 3 μm, followed by drying to prepare a film for supporting the inhibitory compound.

In a darkroom, the PET film on the photosensitive layer side of the above photosensitive material (O) was peeled, laid overlapping with the inhibitory compound-supporting film in such manner that the inhibitory compound-supporting side thereof may face the photosensitive layer, and laminated by allowing them to pass through a heat roller with a temperature raised to 120° C. and applied with a pressure of 25 kg/cm², thus completing an optical recording material.

COMPARATIVE EXAMPLE 1

Example 15 was entirely repeated to prepare an optical recording material, except that 1-phenyl-5-mercapto-1H-tetrazole (the inhibitory compound) was not used and a PET film formed by coating only polyvinyl butyral was laminated on the photosensitive layer.

Evaluation of stability with time

In a darkroom, the optical recording materials prepared in Example 15 and Comparative Example 1 were each put in an environmental test machine regulated to conditions of a temperature of 50° C. and a humidity of 80% RH, to measure changes with time of the reflectance (%) in light with a wavelength of 830 nm (0 hour, 50 hours, and 100 hours). Results obtained are shown in Table 6 below.

TABLE 6

|  | 0 hr | 50 hrs | 100 hrs |
| --- | --- | --- | --- |
| Example 15: |  |  |  |
| Exposed area | 14.7 | 14.8 | 14.5 |
| Unexposed area | 23.5 | 22.6 | 22.0 |
| Comparative Example 1: |  |  |  |
| Exposed area | 14.5 | 14.5 | 14.6 |
| Unexposed area | 23.9 | 19.8 | 18.0 |

As is evident from the reflectance shown in Table 6, the optical recording material of Example 15 causes less change with time in the reflectance at the unexposed area than the optical recording material of Comparative Example 1, and hence it is an optical recording material having a superior stability with time of the recorded information.

EXAMPLE 16

Example 15 was repeated to form a light-to-heat conversion element layer, but employing a composition comprising the components as shown in Table 7 below.

TABLE 7

| Components | pbw |
| --- | --- |
| 1-Guaiazulenyl-5-(6'-butylazulenyl)-pentadienium perchlorate | 2.0 |
| Polyvinyl butyral | 0.3 |
| Dichloroethane | 45 |

The photosensitive layer was also formed in the same manner as in Example 15, and the light-to-heat conversion element layer and the photosensitive layer were laminated to prepare a photosensitive material (P), on which the exposure to light, formation and lamination of the inhibitory compound-supporting film were carried out in the same manner as in Example 15, thus preparing an optical recording material.

COMPARATIVE EXAMPLE 2

Example 16 was entirely repeated to prepare an optical recording material, except that 1-phenyl-5-mercapto-1H-tetrazole (the inhibitory compound) was not used and a PET film formed by coating only polyvinyl butyral was laminated on the photosensitive layer.

Evaluation of stability with time

The optical recording materials prepared in Example 16 and Comparative Example 2 were subjected to the same measurement as in Example 15. Results obtained are shown in Table 8 below.

TABLE 8

|  | 0 hr | 50 hrs | 100 hrs |
|---|---|---|---|
| Example 16: |  |  |  |
| Exposed area | 19.3 | 19.3 | 19.2 |
| Unexposed area | 31.4 | 30.8 | 30.0 |
| Comparative Example 2: |  |  |  |
| Exposed area | 19.2 | 19.2 | 19.2 |
| Unexposed area | 31.6 | 26.4 | 24.8 |

As is evident from the reflectance shown in Table 8, the optical recording material of Example 16 causes less reflectance change with time at the unexposed area than the optical recording material of Comparative Example 2, and hence it is an optical recording material having a superior stability with time of the recorded information.

EXAMPLES 17 TO 20 AND COMPARATIVE EXAMPLE 3

Formation of LHC layer, subbing layer and intermediate layer

In a darkroom, a subbing layer of 200 Å thick, comprising $SiO_2$, was formed on a polymethyl methacrylate substrate with grooves and a thickness of 1.2 mm, and thereafter a light-to-heat conversion element layer of 750 Å thick, comprising 1,5-bisguaiazulenylpentadienium perchlorate was formed. Then, an intermediate layer of 100 to 200 Å thick, comprising polyvinyl alcohol, was formed thereon.

Formation of photosensitive layer

On the intermediate layer, a photosensitive layer of 5,000 Å thick, having the composition as shown in Table 9 below, was formed by spin coating to prepare a photosensitive material (Q).

TABLE 9

| Components | pbw |
|---|---|
| Silver chlorobromide | 0.4 |
| Silver behenate | 5.0 |
| Polyvinyl butyral | 5.0 |
| Sumilizer WXR (a product of Sumitomo Chemical) | 4.0 |
| Phthalazinone | 1.2 |

Writing of recording information

Next, writing of recording information was performed using the recording unit as shown in FIG. 18. The unit shown in FIG. 18 is an unit in which, while rotating the photosensitive material 16, a second harmonic generated from an $LiNbO_3$ nonlinear optical device 13 of a thin film waveguide type, using the fundamental wave from a semiconductor laser 12, is reflected by a mirror 14, whose optical axis is adjusted to that of the fundamental laser beam using a dichroic mirror 15, and information is recorded according to the recording information and based on signals from a modulated signal generator 11. The numeral 24, in FIG. 18, denotes an objective lens.

In the present Example, the recording was carried out under conditions of a semiconductor laser power of 100 W, a frequency of 1 MHz, and rotational speed of the photosensitive material of 450 rpm.

Preparation and lamination of inhibitory compound-supporting film

Example 15 was repeated to prepare an optical recording material by preparing and laminating the inhibitory compound-supporting film, except that the compounds shown in Table 10 below were used as the inhibitory compounds.

TABLE 10

| Example | Inhibitory compound |
|---|---|
| 17 | Ethylisothiourea |
| 18 | 5-Chloro-2-mercaptobenzothiazole |
| 19 | 2-Mercaptobenzothiazole |
| 20 | 1-Phenyl-2-methyl-5-mercapto-1,3,4-triazole |
| comparative Example 3: | None |

In a lightroom, the optical recording materials prepared in Examples 17 to 20 and Comparative Example 3 were each put in an environmental test machine regulated to conditions of a temperature of 50° C. and a humidity of 80% RH, to measure changes with time of the amount of reflected light in the light with a wavelength of 830 nm (0 hour, 50 hours, and 100 hours), from the result of which the changes with time of contrast was calculated. Results obtained are shown in Table 11 below. The contrast was calculated by the following formula:

$$R = (A - B)/A$$

A: the amount of reflected light at the unexposed area
B: the amount of reflected light at the exposed area.

TABLE 11

|  | 0 hr | 50 hrs | 100 hrs |
|---|---|---|---|
| Example 17: | 0.48 | 0.45 | 0.45 |
| Example 18: | 0.47 | 0.43 | 0.42 |
| Example 19: | 0.49 | 0.43 | 0.41 |
| Example 20: | 0.48 | 0.46 | 0.45 |
| Comparative Example 3: | 0.49 | 0.25 | 0.21 |

As is evident from the contrast shown in Table 11, the optical recording materials of Examples 17 to 20 cause less change with time in the contrast than the optical recording material of Comparative Example 3, and hence they are optical recording materials having a superior stability with time, of the recorded information.

We claim:

1. A photosensitive material, comprising: a support bearing a layer comprising (i) a photosensitive and heat-developable element comprising photosensitive silver halide, organic silver salt and reducing agent, and (ii) a light-to-heat conversion element comprising an inorganic metal or organic coloring matter, wherein said light-to-heat conversion element is contained in an amount of from 1 part to 100 parts by weight based on 100 parts by weight of said photosensitive and heat-developable element.

2. A photosensitive material, comprising: a support bearing a photosensitive layer comprising a photosensitive and heat-developable element comprising photosensitive silver halide, organic silver salt and reducing agent, and a light-to-heat conversion element layer comprising a light-to-heat conversion element of an inorganic metal or an organic coloring matter.

3. A photosensitive material, comprising: a photosensitive layer comprising a photosensitive silver halide, organic silver salt and reducing agent, said photosensitive layer being carried upon a support comprising a light-to-heat conversion element comprising an inorganic metal or organic coloring matter.

4. The photosensitive material according to any of claims 1, 2 or 3, wherein said inorganic metal comprises at least one metallic element selected from the elementary group consisting of metals of Ib, IIb, IIIb, IVb, Vb and VIb Groups of the periodic table.

5. The photosensitive material according to any of claims 1, 2 or 3, wherein said organic coloring matter has a light absorption maximum at a wavelength of not less than 600 nm.

6. The photosensitive material according to claim 1, wherein a photosensitive layer containing said light-to-heat conversion element and photosensitive and heat-developable element has a thickness of from 0.005 μm to 2 mm.

7. The photosensitive material according to any of claims 1, 2 or 3, wherein said light-to-heat conversion element layer has a thickness of from 0.005 μm to 1 mm.

8. The photosensitive material according to claims 2 or 3, wherein said photosensitive layer has a thickness of from 0.005 μm to 2 mm.

9. The photosensitive material according to any of claims 1, 2 or 3, wherein said photosensitive silver halide is contained in an amount of from 0.001 mol to 2 mols per mol of said organic silver salt.

10. The photosensitive material according to any of claims 1, 2 or 3, wherein said reducing agent is contained in an amount of from 0.05 mol to 3 mols per mol of said organic silver salt.

11. An image forming method, comprising subjecting the photosensitive material according to any of claims 1, 2 or 3 to imagewise exposure to form a silver image on said photosensitive material.

12. The image forming method according to claim 11, wherein said step of imagewise exposure is the step of imagewise irradiating said photosensitive material with at least two lights having different wavelengths of from 300 nm to 1,300 nm.

13. The image forming method according to claim 11, wherein said step of imagewise exposure is a step of imagewise irradiating said photosensitive material with a laser beam and the second harmonic obtained by use of said laser beam and a nonlinear optical function element.

* * * * *